(12) United States Patent
Kato

(10) Patent No.: US 7,598,565 B2
(45) Date of Patent: *Oct. 6, 2009

(54) SEMICONDUCTOR MEMORY ELEMENT, SEMICONDUCTOR MEMORY DEVICE AND METHOD OF FABRICATING THE SAME

(75) Inventor: Kiyoshi Kato, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 288 days.

This patent is subject to a terminal disclaimer.

(21) Appl. No.: 11/500,445

(22) Filed: Aug. 8, 2006

(65) Prior Publication Data

US 2006/0267077 A1 Nov. 30, 2006

Related U.S. Application Data

(62) Division of application No. 10/735,717, filed on Dec. 16, 2003, now Pat. No. 7,115,941.

(30) Foreign Application Priority Data

Dec. 18, 2002 (JP) .............................. 2002-366600

(51) Int. Cl.
H01L 29/788 (2006.01)
(52) U.S. Cl. ................................. 257/316; 257/E21.689
(58) Field of Classification Search ................. 257/316, 257/324, 66, E21.689
See application file for complete search history.

(56) References Cited

U.S. PATENT DOCUMENTS 3,890,632 A 6/1975 Ham et al.
4,334,347 A 6/1982 Goldsmith et al.
5,289,027 A 2/1994 Terrill et al.

(Continued)

FOREIGN PATENT DOCUMENTS

JP 07-130652 5/1995

(Continued)

OTHER PUBLICATIONS

A. Hara et al., *Ultra-High Performance Poly-Si TFTs on a Glass by a Stable Scanning CW Laser Lateral Crystallization*, AM-LCD '01 Digest of Technical Papers, Jan. 1, 2001, pp. 227-230.

*Primary Examiner*—Mark Prenty
(74) *Attorney, Agent, or Firm*—Eric J. Robinson; Robinson Intellectual Property Law Office, P.C.

(57) ABSTRACT

It is an object to provide a semiconductor memory device having a highly reliable and small-sized involatile memory by realizing a semiconductor memory element which restrains extreme concentration of an electric field onto a surface of activating layer in a channel region and is very minute. Further, it is an object thereof to provide a highly reliable and small-sized semiconductor memory device. There is fabricated a semiconductor memory element in which a surface of an activating layer is flat and which is very minute by using a crystallizing process of a semiconductor activating layer for adding a metal element onto a substrate having an insulating surface to subject to a heating processing and thereafter carrying out continuous oscillating laser irradiation. By using such a semiconductor memory element, a highly reliable and small-sized involatile memory and a semiconductor memory device having the involatile memory are provided.

38 Claims, 15 Drawing Sheets

U.S. PATENT DOCUMENTS

| | | | |
|---|---|---|---|
| 5,470,762 | A | 11/1995 | Codama et al. |
| 5,643,826 | A | 7/1997 | Ohtani et al. |
| 5,728,259 | A | 3/1998 | Suzawa et al. |
| 5,757,030 | A | 5/1998 | Codama et al. |
| 5,840,600 | A | 11/1998 | Yamazaki et al. |
| 5,888,858 | A | 3/1999 | Yamazaki et al. |
| 5,923,962 | A | 7/1999 | Ohtani et al. |
| 6,180,439 | B1 | 1/2001 | Yamazaki et al. |
| 6,335,716 | B1 | 1/2002 | Yamazaki et al. |
| 6,498,369 | B1 | 12/2002 | Yamazaki et al. |
| 6,509,217 | B1 | 1/2003 | Reddy |
| 6,528,397 | B1 | 3/2003 | Taketomi et al. |
| 6,559,036 | B1 | 5/2003 | Ohtani et al. |
| 6,597,014 | B1 | 7/2003 | Yamazaki et al. |
| 6,667,494 | B1 | 12/2003 | Yamazaki et al. |
| 6,670,635 | B1 | 12/2003 | Yamazaki et al. |
| 6,717,179 | B1 | 4/2004 | Yamazaki et al. |
| 6,737,672 | B2 | 5/2004 | Hara et al. |
| 7,115,941 | B2 * | 10/2006 | Kato .................. 257/316 |
| 7,126,156 | B2 | 10/2006 | Yamazaki et al. |
| 2002/0171085 | A1 | 11/2002 | Suzawa et al. |
| 2002/0179964 | A1 | 12/2002 | Kato et al. |
| 2003/0021307 | A1 | 1/2003 | Yamazaki |
| 2003/0035219 | A1 | 2/2003 | Tanaka |
| 2003/0067004 | A1 | 4/2003 | Nakazawa et al. |
| 2003/0075755 | A1 * | 4/2003 | Yamazaki .............. 257/315 |
| 2003/0166315 | A1 | 9/2003 | Tanada et al. |
| 2004/0016958 | A1 | 1/2004 | Kato et al. |
| 2005/0036382 | A1 | 2/2005 | Kato |
| 2007/0034873 | A1 | 2/2007 | Yamazaki et al. |

FOREIGN PATENT DOCUMENTS

| | | |
|---|---|---|
| JP | 08-181231 | 7/1996 |
| JP | 11-143379 | 5/1999 |

* cited by examiner (A)

(B)

(A)

(B)

(A)

(B)

SEMICONDUCTOR MEMORY ELEMENT, SEMICONDUCTOR MEMORY DEVICE AND METHOD OF FABRICATING THE SAME

BACKGROUND OF THE INVENTION

The present invention relates to a semiconductor memory element, particularly relates to a thin film transistor having a charge accumulating layer. Further, the invention relates to a thin film transistor having a charge accumulating layer, and a semiconductor memory device constituted by forming a thin film transistor on a substrate having an insulating surface.

DESCRIPTION OF RELATED ART

EEPROM (Electrically Erasable and Programmable Read Only Memory) or a flash memory is known as a memory representing a semiconductor involatile memory. Since the memories are involatile, different from DRAM (Dynamic Random Access Memory) or SRAM (Static RAM) representing a semiconductor memory, even when power source is cut, data is not lost. Further, when compared with a magnetic disc representing other involatile memory, the memories are provided with characteristics excellent in integration density, impact resistance, power consumption, writing/reading speed and the like.

A semiconductor involatile memory is provided with characteristics suitable for portable apparatus in this way, and application and development of a memory chip using a single crystal silicon substrate to portable apparatus has been progressed. For example, an NAND flash memory having a large capacity of 256 M bit is formed into a product for storing images or music data, further, a laminated layer chip of a flash memory and SRAM aimed at small-sized formation is formed into a product.

Meanwhile, there is intensified a request for a system on panel integrally formed with a display portion and a logic circuit portion on a substrate having an insulting surface with a background of spread of portable apparatus having a display portion such as a portable telephone. In accordance therewith, also a technology for fabricating a semiconductor involatile memory on a substrate having an insulating surface becomes important.

BRIEF SUMMARY OF THE INVENTION

When a semiconductor involatile memory (hereinafter, simply described as involatile memory) is fabricated on a substrate having an insulating surface, there is conceivable a mode of constituting a semiconductor memory element and a thin film transistor (hereinafter, described as TFT) constituting a peripheral circuit of a decoder circuit, writing or reading circuit or the like by a polycrystal semiconductor film.

When considering such an involatile memory on a substrate having an insulting surface, an improvement in reliability and an increase in an integration density of a semiconductor memory element can be pointed out as important problems.

First, with regard to the reliability in the semiconductor memory element on a substrate having an insulting surface, a surface roughness of a semiconductor activating layer is important. Writing and erasing to and from a semiconductor memory element is carried out by injecting charge from a semiconductor activating layer to a charge accumulating layer and discharging charge therefrom. Although, when a method of fabricating a polycrystal semiconductor film of a prior art is used, projections and recesses of a surface of the semiconductor activating layer are large, in writing or erasing charge to and from the semiconductor memory element, an electric field is concentrated on the projection and a local deterioration is brought about at a gate insulating film interposed by the semiconductor activating layer and the charge accumulating layer. As a result, the reliability of the semiconductor memory element is deteriorated.

Further, as a method of fabricating a polycrystal semiconductor film of a prior art, laser crystallization by excimer laser or thermal crystallization or the like is given. In any of the cases, a ridge (projection in a roof-like shape) is formed on a surface along a grain boundary of a crystal grain constituting a semiconductor film and projections and recesses of a surface of the semiconductor activating layer are large.

Further, with regard to the integration density of the semiconductor memory element on the insulting surface, there poses a problem that an element area is larger than that of a silicon substrate. As a reason therefor, it is pointed out that micromachining is difficult because recesses and projections or waviness of a surface in a substrate having an insulating surface is larger than that of the silicon substrate, and that characteristics are inferior in transistors having the same size. For example, whereas a transistor having a channel length equal to or smaller than 0.1 μm is fabricated on a silicon substrate, TFT having a channel length of about 3 μm is fabricated on a glass substrate, in that case, the element area becomes about 900 times. Therefore, promotion of the integration density becomes an important problem in the involatile memory on the insulating surface.

The invention has been carried out in view of the above-described problems and it is an object thereof to provide a semiconductor memory device having a highly reliable small-sized involatile memory by realizing a semiconductor memory element which restrains extreme concentration of an electric field on a surface of an activating layer in a channel region and is very small.

EFFECT OF THE INVENTION

By the invention, there can be realized a semiconductor memory element and TFT of which a surface of a semiconductor activating layer are flat and which are fine.

It means high resistance to rewriting a semiconductor memory element that the surface of the semiconductor activating layer is flat and an involatile memory having high reliability can be realized. Further, by enabling to realize a fine semiconductor memory element and TFT simultaneously, an element area can be reduced, and an involatile memory which is provided with a small area or a large capacity with the same area can be realized.

As a result, a semiconductor memory device having a highly reliable small-sized involatile memory can be realized.

DETAILED DESCRIPTION OF THE INVENTION

Figure 1:
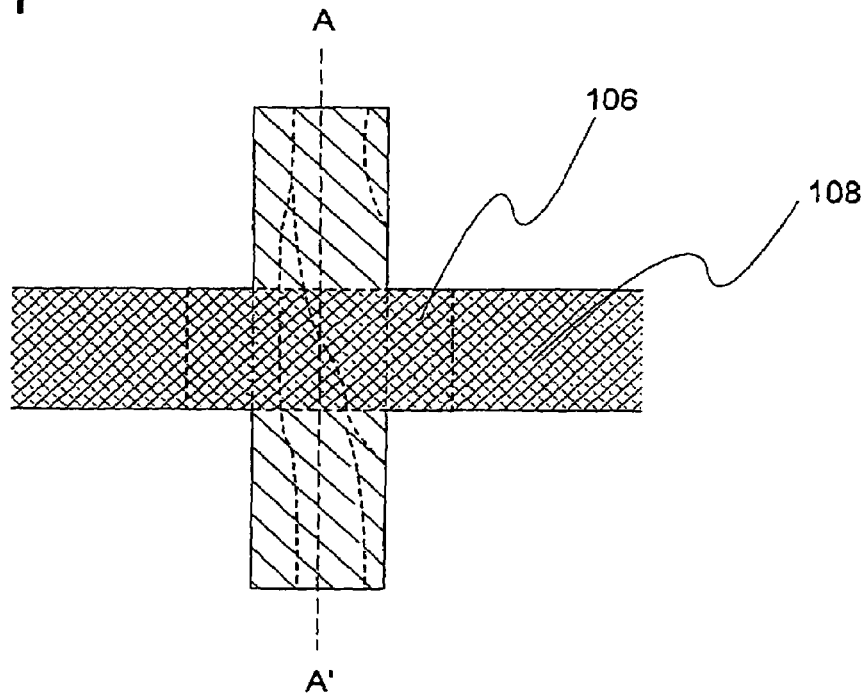
FIGS. 1A-1B are a plane view and a sectional view of a semiconductor memory element according to the invention.
Figure 1:
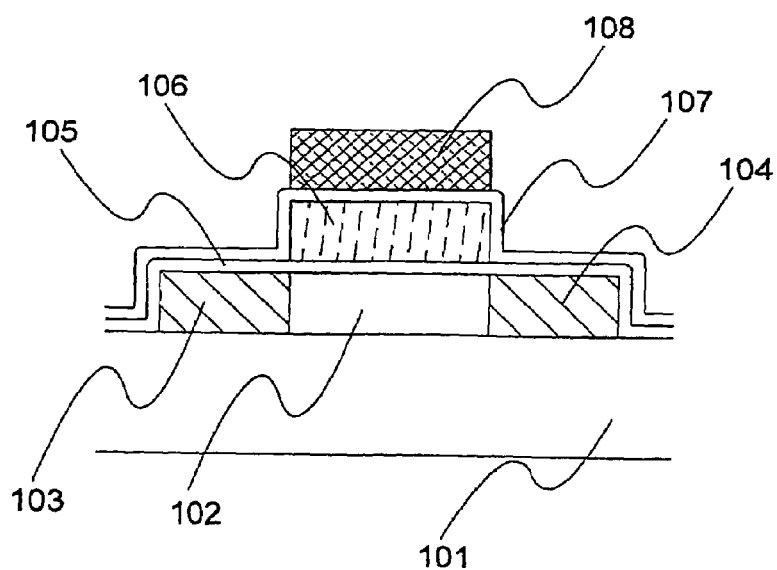

The invention is characterized in fabricating a polycrystal semiconductor film by irradiating laser beam using continuously oscillating laser in order to reduce a surface roughness of a surface of an activating layer. Further, the invention is characterized in that a heating treatment using a metal catalyst is carried out before a step of fabricating the polycrystal semiconductor film by irradiating laser beam in order to promote a characteristic of a semiconductor memory element and TFT having a flat surface of an activating layer thus obtained.

Further, the polycrystal semiconductor film according to the invention is a semiconductor film constituted by aggregating crystal grains and includes a film constituted by crystallizing an amorphous semiconductor film by a publicly-known method. Representatively, a polycrystal silicon film is applied thereto and other than the film, a crystalline silicon germanium film, a crystalline silicon carbide film or the like can also be applied thereto. Further, the amorphous semiconductor film not only includes a semiconductor film having a complete amorphous structure in a narrow sense but also includes a semiconductor film in a state of including a fine crystal grain, or a so-to-speak fine crystal semiconductor film, or including a crystal structure locally. Representatively, an amorphous silicon film is applied thereto.

Further, the semiconductor memory element indicates a thin film transistor having a charge accumulating layer surrounded by an insulating film between the semiconductor activating layer and a gate electrode and includes a thin film transistor having, for example, a structure having a floating gate electrode, an MNOS structure, or an MONOS structure in a category thereof.

In recent years, as a step of fabricating TFT realizing a high mobility, attention is attracted to a technology of fabricating a polycrystal semiconductor film by irradiating laser beam. Although a polycrystal semiconductor film is fabricated by irradiating laser beam also in the invention, the invention is characterized in that a principal object thereof is not to realize high mobility but to flatten a surface of the semiconductor film. Although details thereof will be explained in embodiments, specifically, continuously oscillating laser is used, a semiconductor film is melted by irradiating the laser beam and crystallized by continuously scanning the laser beam.

According to the invention, the continuous scanning signifies continuous scanning during a time period of scanning a channel region of the semiconductor element which needs to flatten at least a surface of the semiconductor film. In other words, it is characterized in that irradiation of laser beam is not interrupted during a time period of irradiating laser beam to the channel region.

When such a fabricating method is used, it has been confirmed that a ridge formed along a crystal boundary in a polycrystal semiconductor film of a prior art is not formed at a surface of the semiconductor activating layer and the grain boundary is flat or formed with a gradual recessed portion.

Figure 2:
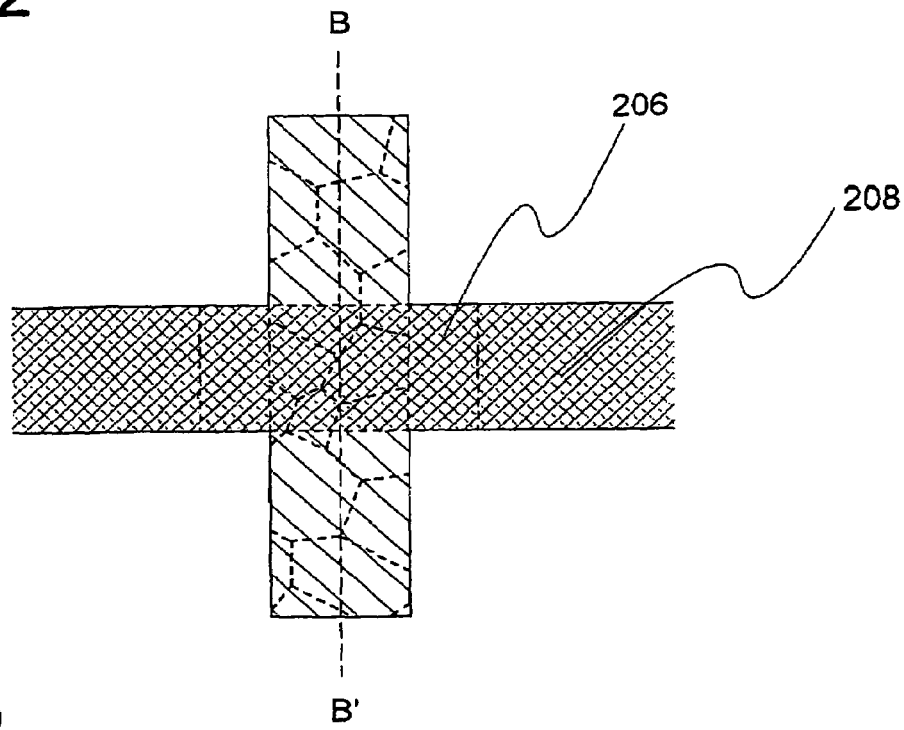
FIGS. 2A-2B are a plane view and a sectional view of a semiconductor memory element of a conventional art.
Figure 2:
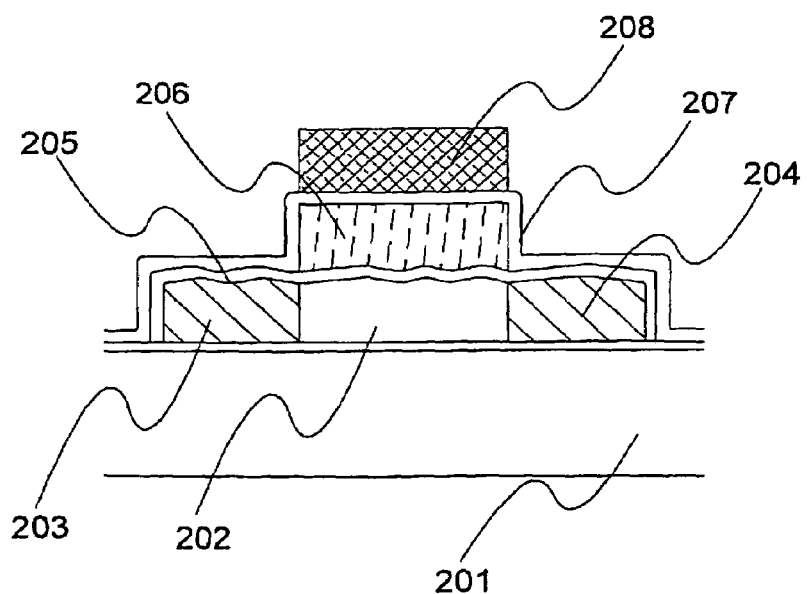

FIG. 1 and FIG. 2 show typical structures (schematic views) of semiconductor memory elements of the invention and the prior art.

FIG. 2 shows a schematic structure of a semiconductor memory element fabricated by using laser crystallization by excimer laser or thermal crystallization as a conventional method and (1) and (2) are respectively a plane view and a sectional view in a channel direction (B-B' direction). In FIG. 2, a semiconductor memory element is constructed by a structure of laminating a semiconductor activating layer comprising a channel region 202, and a pair of one conductive type impurity regions 203, 204, a first gate insulating film 205, a floating gate electrode 206, a second gate insulating film 207, and a control gate electrode 208 over a substrate 201 having an insulating surface.

In FIG. 2, as shown by the plane view, the semiconductor film is formed by aggregating crystal grains expressed by dotted lines and the crystal grain is constituted by a random shape without being particularly elongated in one direction. Further, as shown by the sectional view, a ridge is formed on a surface along a boundary of the crystal grain (hereinafter, described as crystal grain boundary) to enlarge projections and recesses of the surface of the semiconductor activating layer.

Meanwhile, FIG. 1 shows a schematic structure of a semiconductor memory element according to the invention and FIGS. 1 (1) and 1 (2) are respectively a plane view and a sectional view in a channel direction (A-A' direction). In FIG. 1, the semiconductor memory element is constituted by a structure of laminating a semiconductor activating layer comprising a channel region 102, and a pair of one conductive type impurity regions 103, 104, a first gate insulating film 105, a floating gate electrode 106, a second insulating film 107, and a control gate electrode 108 over a substrate 101 having an insulating surface.

In FIG. 1, a crystal grain constituting the semiconductor film has a structure of being elongated in one direction. Further, a ridge is not formed at a surface along a crystal grain boundary, the grain boundary is flat or formed with a gradual recessed portion and the surface of the semiconductor activating layer becomes flat.

Further, the direction of elongating the crystal grain coincides with a direction of scanning laser beam. Further, a size of a crystal grain (hereinafter, also referred to as grain size) constituting the semiconductor activating layer fabricated by the invention is about 0.5 μm through 100 μm in the transverse direction and about 3 μm through 10000 μm in the longitudinal direction.

Further, when laser is scanned in parallel with the channel direction, in comparison with a case of scanning laser orthogonally thereto, a driving function of TFT and a semiconductor memory element is promoted. This is because since the crystal grain boundary is formed substantially in parallel with the scanning direction of laser and therefore, by scanning laser in parallel with the channel direction, a number of pieces of the crystal grain boundaries traversing the channel can be reduced.

The semiconductor memory device of the invention may include a peripheral circuit of a decoder circuit for selecting a semiconductor memory element, writing/reading circuit, or the like, or other semiconductor integrated circuit over a substrate of forming the semiconductor memory element. In that case, in order to realize high speed operation of a memory, it is preferable to scan laser beam in parallel with the channel direction in TFT constituting a semiconductor memory element, a peripheral circuit, or other semiconductor integrated circuit. Naturally, according to the invention, in view of an object of flattening the surface of the activating layer of the channel region, the scanning direction of laser is not limited to the channel direction.

Further, the semiconductor memory device according to the invention generally refers to an involatile memory of EEPROM (Electrically Erasable and Programmable Read Only Memory) or a flash memory and a semiconductor device including such an involatile memory as a semiconductor storing portion. For example, a microprocessor having an involatile memory as a semiconductor storing portion and a semiconductor display apparatus (representatively, liquid crystal display apparatus and EL display apparatus) are included in the category.

Further, FIG. 1 and FIG. 2 show a mode of the semiconductor memory element having the floating gate electrode comprising the charge accumulating layer. Further, although as the impurity region, a constitution in which the impurity region does not overlap the floating gate electrode is shown, the impurity region and the floating gate electrode may partially overlap each other with an object of drawing charge from the floating gate in erasing (or in writing) via the first gate insulating film.

Figure 3A:
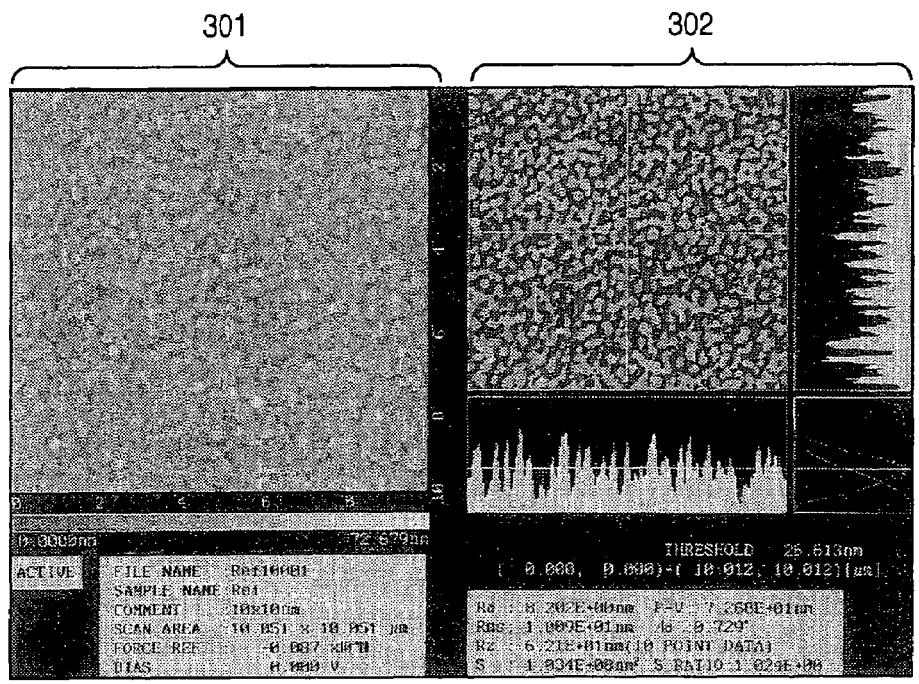
FIGS. 3A-3B are AFM images of a surface of a semiconductor film.
Figure 3B:
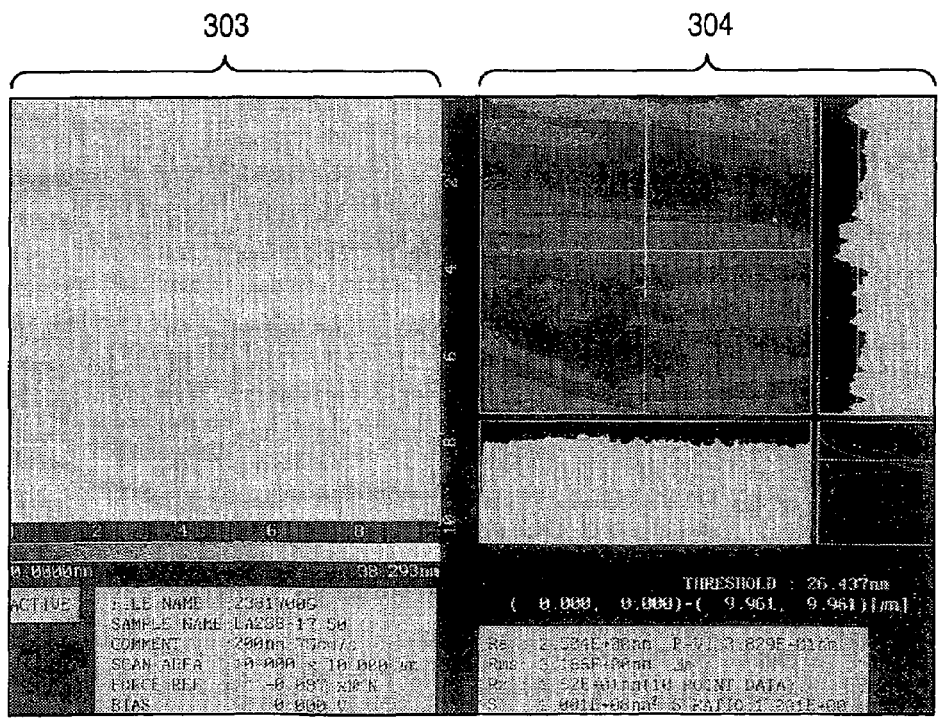
Figure 4A:
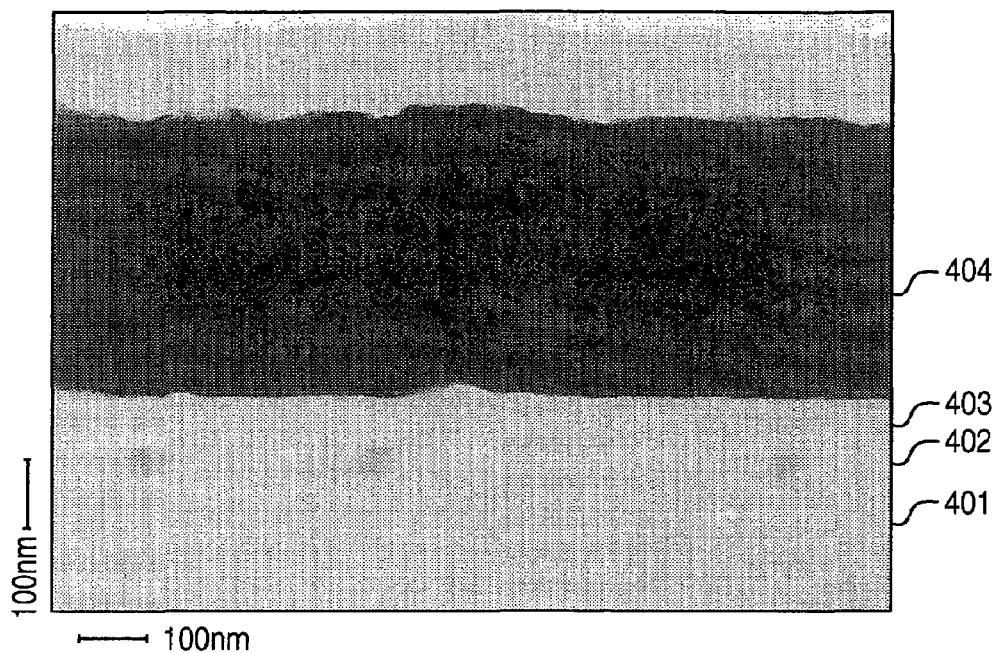
FIG. 4A-4B are photographs of a transmission electron microscope (TEM) of a section of a semiconductor film.
Figure 4B:
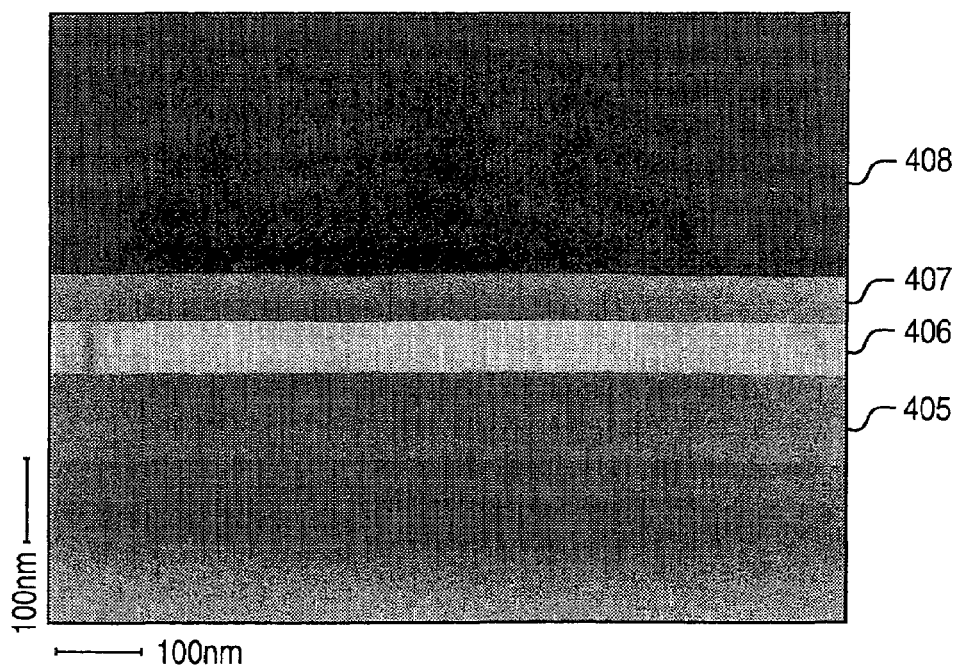

Next, as a specific data, an AFM image of a surface and a TEM image of a section of a polycrystal semiconductor film are shown in FIGS. 3, 4.

FIG. 3 (A) shows an AFM image of a polycrystal semiconductor film of a prior art and FIG. 3 (B) shows an AFM image of a polycrystal semiconductor film formed by using continuously oscillating laser.

In FIG. 3, images 301 and 303 are images of 10 μm square expressing recesses and projections of surfaces by a gray scale. Further, images 302 and 304 show images expressing heights of surfaces by binary values by constituting a boundary by an average height, and graphs expressing recesses and projections of sections in a vertical direction and a horizontal direction.

The semiconductor film shown in FIG. 3 (A) is a sample using Ni as a catalyst element and subjected to thermal crystallization (450° C., 4 h). In FIG. 3 (B), a behavior of the polycrystal semiconductor film in which crystal grains of about 0.3 μm without a shape anisotrophy are aggregated can be confirmed. Further, the semiconductor film shown in FIG. 3 (B) is a sample subjected to crystallization by using second harmonic of Nd: $YVO_4$ laser and scanning the laser by an output 8 W and scanning speed of 75 cm/s. In FIG. 3 (B), a behavior of the polycrystal semiconductor film in which crystal grains elongated in a horizontal direction of about 0.2 through 2 μm in the transverse direction and 10 μm or more in the longitudinal direction are aggregated can be confirmed.

When a surface roughness is evaluated by each AFM image, although in a sample by thermal crystallization, a surface roughness is 73 nm by a P-V (peak to valley) value within 10 μm×10 μm and 10 nm by a rms (root mean square) value, in the sample subjected to laser crystallization, the surface roughness is 38 nm by a P-V value within 10 μm×10 μm and 3.2 nm by a rms value (root mean square) and it is known that a surface of the sample subjected to laser crystallization is much flatter than that of the sample subjected to thermal crystallization.

In this way, according to the invention, the surface of the semiconductor activating layer having the P-V value of 0.1 nm through 60 nm, preferably, 1 through 40 nm can be realized and a surface of 0.1 nm through 5 nm by rms value (root mean square), preferably, 1 through 3.5 nm can be realized.

Further, FIG. 4 (A) shows a TEM image of a section of a polycrystal semiconductor film of the prior art and FIG. 4 (B) shows a TEM image of a section of a polycrystal semiconductor formed by using continuously oscillating laser.

Both of the respective TEM images are provided with a magnification of 200,000, and in FIG. 4, thin films 401 and 405 are matrix films, thin films 402 and 406 are polycrystal semiconductor films, thin films 403, 407 are gate insulating films, and black thin films 404, 408 are gate electrodes.

Further, a semiconductor film shown in FIG. 4 (A) is a sample using Ni as a catalyst element and subjected to thermal crystallization (450° C., 4 h) and the semiconductor film shown in FIG. 3 (B) is a sample using second harmonic of Nd: $YVO_4$ laser and subjected to crystallization by being scanned by an output 7 W and a scanning speed of 50 cm/s.

It is known that the sample subjected to laser crystallization is substantially flat as a whole although small strain is observed in the polycrystal semiconductor film at several portions where blackish patterns are seen. Meanwhile, according to the sample subjected to thermal crystallization, there is seen a behavior in which a total thereof is patterned, recesses and projections of the surface of the semiconductor film are large as a whole and the recesses and projections are also reflected to at a gate oxide film at an upper layer.

In this way, according to the invention, the ridge on the crystal grain boundary is restrained in the channel region by using the continuously oscillating laser, irradiating the laser beam to the semiconductor film to melt and crystallizing the semiconductor film by continuously scanning the laser beam, and the surface of the semiconductor activating layer can be made to be very flat. As a result, in the surface of the activating layer, a region on which an electric field is extremely concentrated is reduced and reliability of the first gate insulating film can be promoted.

Next, a description will be given of a problem when TFT and the semiconductor memory element fabricated by the above-described method are miniaturized.

In promoting miniaturization, a problem of improvement of machining accuracy and characteristic of fine element is pointed out and with regard to machining accuracy, machining to submicron order can be carried out even on a glass substrate having large recesses and projections and waviness which is normally used in a liquid crystal display by using an exposure apparatus (i radiation stepper or the like) having a high resolution and by increasing a focal depth in exposure. Meanwhile, it has been found that according to TFT fabricated by using a crystallizing step by above-described irradiation of laser beam, there poses a problem in the characteristic before a gate length reaches submicron order although naturally depending on processing conditions.

Figure 5:
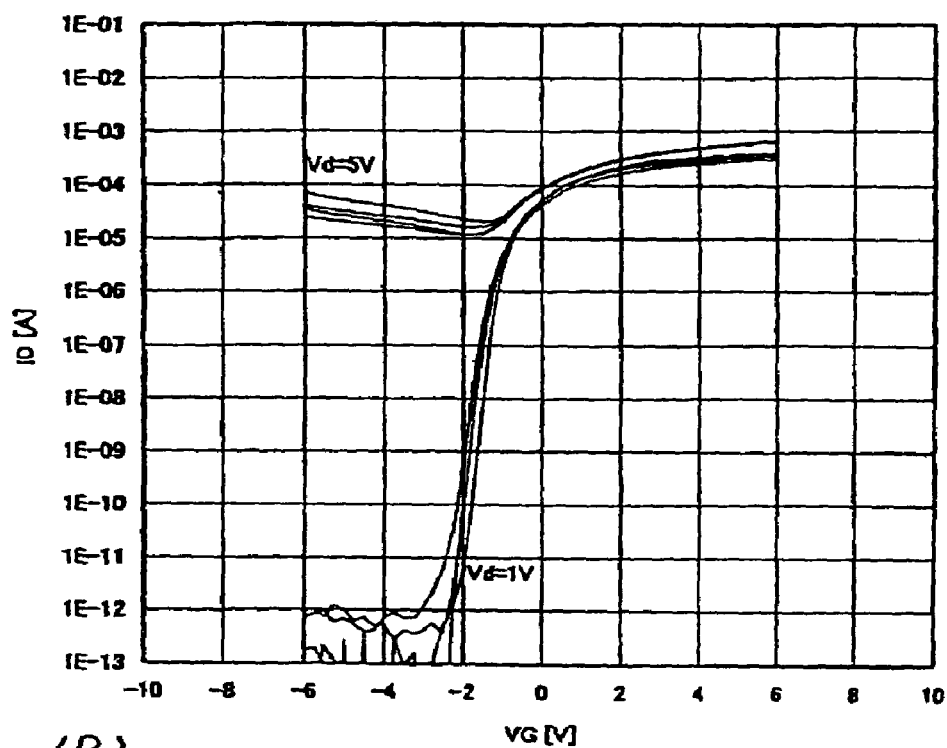
FIGS. 5A-5B are current characteristics of a semiconductor element according to the invention.
Figure 5:
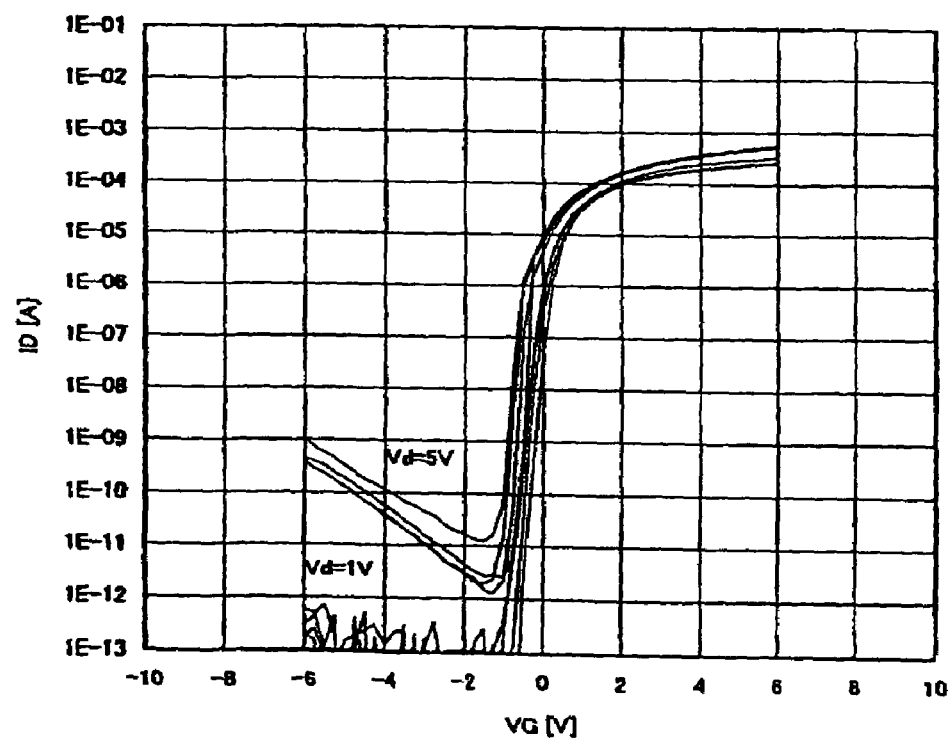

FIG. 5 (A) shows a VG-ID curve of TFT fabricated by using the above-described crystallizing step by laser. The sample is TFT crystallized by using second harmonic of Nd: $YVO_4$ laser and scanning the laser by an output of 7 W and scanning speed of 50 cm/s, channel length L=1.3 μm, channel width W=8 μm, a film thickness of the semiconductor accumulating layer is 54 nm and a thickness of the gate insulating film is 55 nm. Further, VD=5 V.

According to a TFT characteristic shown in FIG. 5 (A), although normal behavior is observed at VD=1 V, a clear abnormality is observed in off current at VD=5 V. This signifies that a switching function is hardly provided to the sample at power source voltage of 5 V and the sample cannot be used as a semiconductor memory element or TFT.

The invention is characterized in carrying out a heating treatment using a metal element before the crystallizing step by irradiating laser in order to restrain this abnormality of the characteristic. FIG. 5 (B) shows a VG-ID curve of TFT fabricated by such a method. Although a condition of irradiating laser beam is the same as that of a sample shown by a broken line, a heat treatment step (450° C., 4 h) adding Ni as a metal catalyst is carried out therebefore, channel length L=1.3 μm, channel width W=8 μm, a film thickness of a semiconductor activating layer is 54 nm and a gate insulating film thickness is 55 nm.

As is seen in FIG. 5, according to TFT subjected to the heating treatment by using a metal element, different from a case in which the heating treatment is not carried out, there is not the abnormality of the off current even at VD=5V and the normal current characteristic is confirmed.

In this way, it has been found that there is achieved an effect of restraining the abnormality of the characteristic brought about in accordance with miniaturization of TFT or semiconductor memory element by carrying out the heating treatment using a metal element before the crystallizing step using continuously oscillating laser. As a result, according to the invention, finer TFT or semiconductor memory element can be realized.

Naturally, a channel length L=1.3 μm shown here is an example. According to TFT subjected to the heating treatment using a metal element, mainly, at the channel length equal to or smaller than 2 μm, an effect of restraining the abnormality of the off current is observed in comparison with the case in which the heating treatment is not carried out. Therefore, according to the invention, the effect is achieved by constituting the channel length of a semiconductor memory element and TFT by L=0.01 μm through 2 μm.

Further, in the step of fabricating a semiconductor memory element and TFT according to the invention, although depending on a gettering step of removing the added metal element, there is a case in which the metal element is included in the fabricated semiconductor activating layer by a concentration of $1\times10^{16}/cm^3$ through $5\times10^{18}/cm^3$.

By using the fabricating method of the invention, a semiconductor memory element and TFT a surface of the semiconductor activating layer of which is flat and which is very small can be realized. It means high resistance to rewriting a semiconductor memory element that the surface of the semiconductor activating layer is flat and an involatile memory having high reliability can be realized. Further, by enabling to realize a fine semiconductor memory element and TFT simultaneously, an element area can be reduced, and an involatile memory which is provided with a small area or a large capacity with the same area can be realized.

By the invention, there can be realized a semiconductor memory element formed on a substrate having an insulating surface and including a semiconductor activating layer comprising a channel region and one conductive impurity region, a first gate insulating film, a charge accumulating layer, a second gate insulating film, and a control gate electrode and a semiconductor memory element simultaneously having the following characteristics (1), (2), (3).

(1) A semiconductor activating layer includes a metal element by a concentration of $1\times10^{16}/cm^3$ through $5\times10^{18}/cm^3$, or the semiconductor activating layer is a polycrystal semiconductor film subjecting a semiconductor film added with the metal to a heating treatment, or the channel length of the semiconductor memory element is 0.01 μm through 2 μm.

(2) The channel region is a polycrystal semiconductor film crystallized by being scanned continuously at least in the same channel region in irradiating laser beam, or the semiconductor activating layer is a polycrystal semiconductor film constituted by aggregating a plurality of crystal grains elongated in the same direction.

(3) A semiconductor memory element characterized in that a grain boundary of a crystal grain constituting the semiconductor activating layer is flat or formed with a recessed portion, or a surface roughness of the channel region is 0.1 nm through 60 nm in a P-V value, or the surface roughness of the channel region is 0.1 nm through 5 nm in a rms value.

Further, it is preferable that the metal element is one kind or a plurality of kinds selected from Fe, Ni, Co, Ge, Sn, Pd, Pt, Cu, and Au.

By the invention, there is provided a semiconductor memory device characterized in including a memory cell array arranged with the semiconductor memory element in a shape of a matrix.

By the invention, there is provided a semiconductor memory device characterized in that a memory cell array arranged with the semiconductor memory element in a shape of a matrix is formed over a plastic substrate or a ceramic substrate.

By the invention, there is provided a semiconductor memory device characterized in including an IC chip constituted by laminating an involatile memory having a memory cell array arranged with the semiconductor memory element in a shape of a matrix.

As the semiconductor memory device, a game machine, a video camera, a head attaching type display, a DVD player, a personal computer, a portable telephone, or a car audio is provided.

By the invention, there is provided a method of fabricating a semiconductor memory element characterized in a method of fabricating a semiconductor memory element over a substrate having an insulating surface, the method comprising the steps of forming an amorphous semiconductor film over the substrate having the insulating surface, adding a metal element promoting crystallization to the amorphous semiconductor film, subjecting the amorphous semiconductor film to a heating treatment, irradiating a laser beam to the amorphous semiconductor film, forming a polycrystal semiconductor film by scanning the laser beam continuously at least in the same channel region, forming a first gate insulating film on the polycrystal semiconductor film, and forming a charge accumulating layer, a second gate insulating film, and a control gate electrode to laminate over the first gate insulating film.

BEST MODE FOR CARRYING OUT THE INVENTION

Embodiment Mode 1

Figure 6:
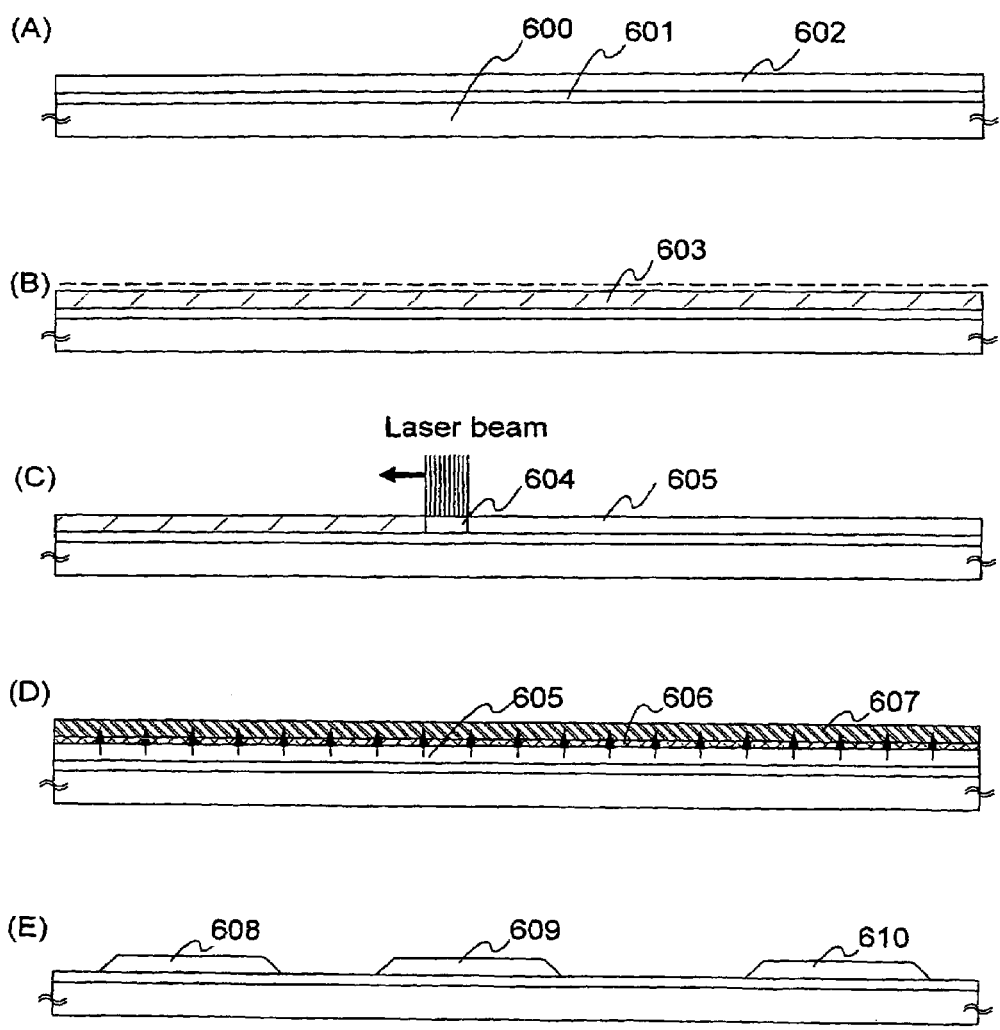
FIGS. 6A-6E are sectional views for explaining steps of fabricating a semiconductor memory element according to the invention.

An explanation will be given of a mode of a method of fabricating a polycrystal semiconductor film according to the invention. FIG. 6 is used for the explanation.

First, as shown by FIG. 6 (A), a matrix film 601 is formed over a substrate 600. A glass substrate of, for example, barium borosilicate glass, aluminoborosilicate glass or the like, a quartz substrate, an SUS substrate or the like can be used for the substrate 600. Further, although according to a substrate comprising a flexible synthetic resin of plastic or the like, generally, a heat resistance temperature tends to be lower than that of the above-described substrate, such a substrate can be used so far as the substrate can withstand treating temperature in a fabricating step.

The base film 601 is provided for preventing an alkaline metal of Na or the like or an alkaline earth metal included in the substrate 600 from diffusing into a semiconductor film to effect adverse influence on characteristics of the semiconductor element. Therefore, the matrix film 601 is formed by using an insulating film of silicon oxide, silicon nitride, silicon oxinitride or the like capable of restraining an alkaline metal or an alkaline earth metal from diffusing into a semiconductor film. According to the embodiment mode, a silicon oxinitride film is formed by using a plasma CVD method to constitute a film thickness of 10 through 400 nm (preferably, 50 through 300 nm).

Further, the base film 601 may be constituted by a single layer or may be laminated with a plurality of insulating films. Further, it is not necessarily needed to provide when diffusion of impurity does not pose a serious problem as in a quartz substrate or the like.

Next, a semiconductor film 602 is formed over the base film. A film thickness of the semiconductor film 602 is set to 25 through 100 nm (preferably, 30 through 60 nm). Further, the semiconductor film 602 may be constituted by an amorphous semiconductor or may be constituted by a polycrystal semiconductor. Further, not only silicon but also silicon germanium can be used for the semiconductor. When silicon germanium is used, it is preferable that a concentration of germanium is about 0.01 through 4.5 atomic %.

Next, as shown by FIG. 6 (B), a nickel acetate solution including Ni of 1 through 100 ppm in conversion to weight is applied to a surface of the semiconductor film 602 by a spin coating method. Further, addition of a catalyst is not limited to the above-described method but the catalyst may be added by using a sputtering method, a vapor deposition method, a plasma treatment or the like.

Next, a heating treatment is carried out at 500 through 650° C. for 4 through 24 hours, for example, at 570° C. for 14 hours. By the heating treatment, there is formed a semiconductor film 603 in which crystallization is promoted in a longitudinal direction from the surface applied with the nickel acetate solution toward the substrate 600 (FIG. 6 (B)).

Further, although according to the embodiment mode, nickel (Ni) is used as a catalyst element, otherwise, an element of germanium (Ge), iron (Fe), palladium (Pd), tin (Sn), lead (Pb), cobalt (Co), platinum (Pt), copper (Cu) or gold (Au) may be used.

Next, as shown by FIG. 6 (C), the semiconductor film 603 is crystallized by irradiating laser beam thereto. As means for melting a polycrystal semiconductor film and continuously scanning the film to crystallize, continuously oscillating laser beam constituting a light source by a gas laser oscillating apparatus, or a solid laser oscillating apparatus is applied. Irradiated laser beam is focused linearly by an optical system and an intensity distribution thereof may be provided with a uniform region in a longitudinal direction and may be provided with a distribution in a transverse direction. A rectangular beam solid laser oscillating apparatus is applied to a laser oscillating apparatus used as a light source, particularly preferably, a slab laser oscillating apparatus is applied thereto.

By irradiating the laser beam focused linearly and expanded in the longitudinal direction to an amorphous semiconductor film or a polycrystal semiconductor film and moving a position of irradiating the laser beam and the substrate formed with the semiconductor film relative to each other and scanning the laser beam to a portion or a whole area, the semiconductor film is melted to thereby carry out crystallization or recrystallization by being processed under the state.

A crystal having a large grain size can be provided by using a solid laser capable of carrying out continuous oscillation and using a second harmonic through a fourth harmonic of a basic wave. For example, representatively, it is preferable to use a second harmonic (532 nm) or a third harmonic (355 nm) of Nd: $YVO_4$ laser (basic wave: 1064 nm). Specifically, laser beam emitted from continuously oscillated $YVO_4$ laser is converted into a harmonic by a nonlinear optical element to provide laser beam having an output of 10 W. Further, there is also a method of emitting a harmonic by putting $YVO_4$ crystal and a nonlinear optical element into a resonator. Further, preferably, laser beam is formed into a rectangular shape or an elliptical shape at an irradiating surface by an optical system to irradiate to the semiconductor film 603. An energy density at this occasion needs to be about 0.01 through 100 $MW/cm^2$ (preferably, 0.1 through 10 $MW/cm^2$). Further, an amorphous semiconductor film 604 is moved relative to laser beam to irradiate by a speed of about 10 through 2000 cm/s.

Further, the crystal grain provided by the invention is provided with a shape elongated in a direction of scanning the laser beam and the crystal grain size becomes about 0.5 μm through 100 μm in the transverse direction and about 1 μm through 10000 μm in the longitudinal direction.

By the above-described irradiation of the laser beam to the semiconductor film 603, a semiconductor film 605 further promoting crystalline performance is formed.

Further, it seems that a metal element (Ni in this case) is included in the semiconductor film 605 subjected to the heating treatment by using the metal element by a concentration of about $1 \times 10^{19}$ $atoms/cm^3$. Next, gettering of the metal element present in the semiconductor film 605 is carried out.

First, as shown by FIG. 6 (D), an oxide film 606 is formed over a surface of the semiconductor film 605. By forming the oxide film 606 having a film thickness of about 1 through 10 nm, the surface of the semiconductor film 605 can be prevented from being roughened by etching in a later etching step.

The oxide film 606 can be formed by using a publicly-known method. For example, the oxide film 606 may be formed by oxidizing the surface of the semiconductor film 605 by, for example, an aqueous solution mixed with a sulphuric acid, hydrochloric acid, nitric acid or the like and hydrogen peroxide water, or ozone water, or may be formed by a plasma treatment, a heating treatment, ultraviolet ray irradiation in an atmosphere including oxygen. Further, the oxide film may be separately formed by a plasma CVD method, a sputtering method, a vapor deposition method or the like.

Next, a semiconductor film 607 for gettering including a rare gas element by a concentration equal to or larger than $1 \times 10^{20}$ $atoms/cm^3$ is formed over the oxide film 606 by a thickness of 25 through 250 nm by using a sputtering method. It is further preferable to use the semiconductor film 607 for gettering having a density of the film lower than that of the semiconductor film 605 in order to increase a selection ratio of etching more than that of the semiconductor film 605.

As the rare gas element, there is used a kind or a plurality of kinds selected from the group consisting of helium (He), neon (Ne), argon (Ar), krypton (Kr) and xenon (Xe).

Next, gettering is carried out by subjecting the film to a heating treatment by using a furnace annealing method or an RTA method. When the furnace annealing method is carried out, a heating treatment is carried out at 450 through 600° C. for 0.5 through 12 hours in a nitrogen atmosphere. Further, when the RTA method is used, a lamp light source for heating is lighted for 1 through 60 seconds, preferably, 30 through 60 seconds, and the lighting is repeated by 1 through 10 times, preferably, 2 through 6 times. Although a light emitting intensity of the lamp light source is made to be arbitrary, the semiconductor film is made to be heated instantaneously up to about 600 through 1000° C., preferably, 700 through 750° C.

By the heating treatment, the catalyst element in the semiconductor film 605 is moved to the semiconductor film 607 for gettering to getter by diffusion as shown by an arrow.

Next, the semiconductor film 607 for gettering is etched to remove. Etching can be carried out by a dry etching in which a plasma by $ClF_3$ is not used, or a wet etching by an alkaline solution of an aqueous solution including hydrazine, or tetramethyl ammonium hydroxide $((CH_3)_4NOH)$. At this occasion, the semiconductor film 605 can be prevented from being etched by the oxide film 606.

Next, the oxide film 606 is removed by hydrogen fluoride.

Further, in the invention, the gettering step is not limited to a method shown in the embodiment mode. The metal element in the semiconductor film may be reduced by using an other method.

Next, as shown by FIG. 6 (E), the semiconductor film 603 is patterned, semiconductor films 608 through 610 in an island-like shape are formed, and a semiconductor memory element and TFT are formed by using the semiconductor films 608 through 610 in the island-like shape.

Further, by carrying out crystallization by irradiating a laser beam as in the embodiment mode, a semiconductor film of which a surface is very flat can be fabricated. Further, by adding the metal element and by the heat treatment step, there can be fabricated a TFT finer than that in the case in which the metal element is not added and the heat treatment step is not carried out.

Further, by using the semiconductor film fabricated as described above as activating layers of the semiconductor memory element and TFT, a semiconductor memory device which is provided with a highly reliable and small-sized involatile memory can be realized.

Embodiment Mode 2

Figure 7:
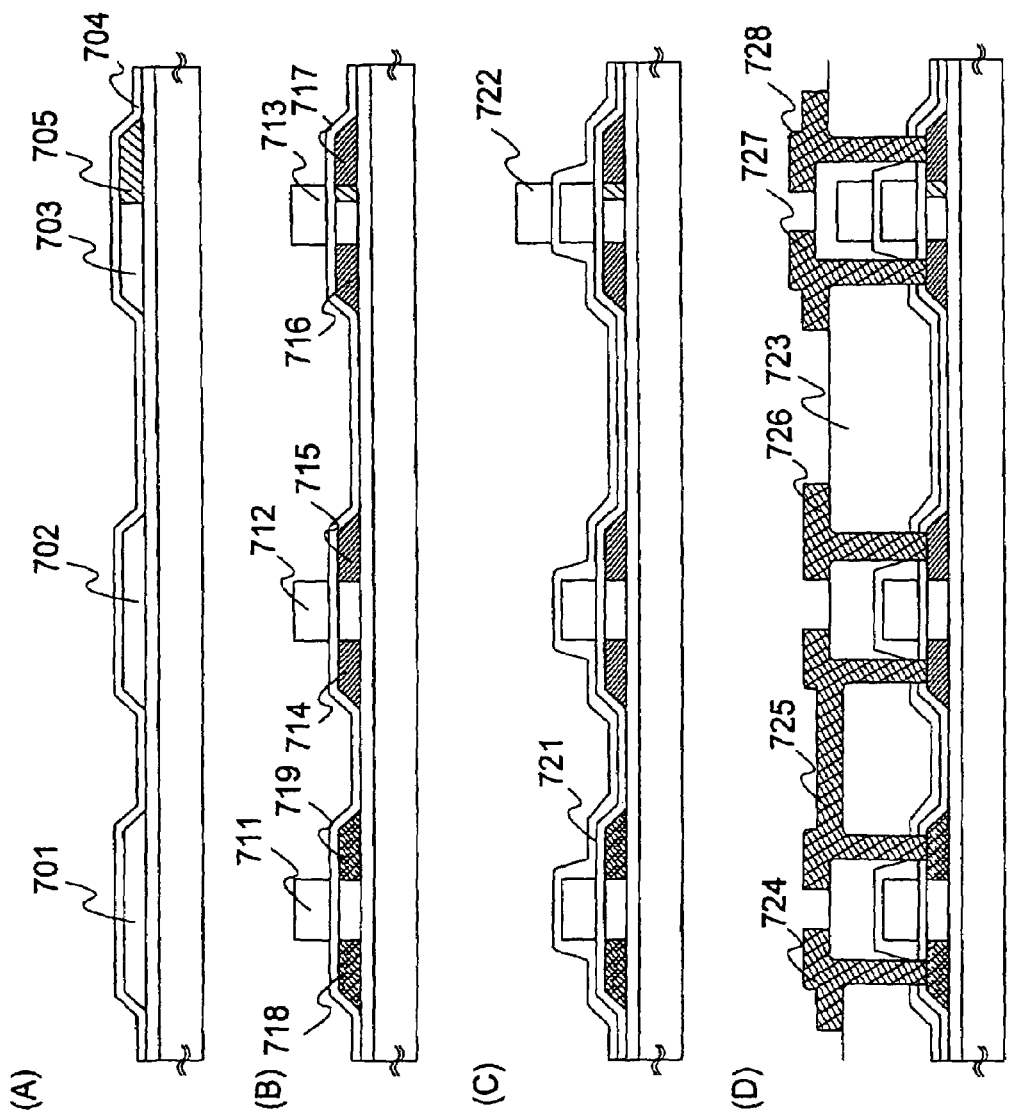
FIGS. 7A-7D are sectional views for explaining steps of fabricating a semiconductor memory element according to the invention.

Next, an explanation will be given of a mode of fabricating an involatile memory by using an island-like semiconductor film formed in accordance with a fabricating method explained in Embodiment Mode 1. FIG. 7 is used for the explanation.

According to the embodiment mode, a mode of simultaneously fabricating a memory cell and a peripheral circuit is shown and a right side of the drawing shows steps of fabricating a semiconductor memory element and a left side thereof shows steps of fabricating an n-channel type TFT and a p-channel type TFT representing a peripheral circuit.

Further, TFT is constituted by a single drain structure and the semiconductor memory element is constituted by a structure of providing an overlapping region for drawing charge in erasing.

Island-like semiconductor films 701 through 703 shown in FIG. 7 (A) are fabricated in accordance with Embodiment Mode 1. Although the direction of scanning laser beam may be arbitrary from a standpoint of a surface roughness at this time, it is preferable to make the direction of scanning laser beam in parallel with a channel direction with an object of promoting a function of driving the semiconductor memory element and TFT. Further, it is preferable to make an angle made by the channel direction and the direction of scanning laser beam the same among elements intended to restrain a variation thereamong.

First, a silicon oxide film or a silicon oxynitride film of 10 through 200 nm is formed by using a plasma CVD method or a sputtering method as a first gate insulating film 704.

Further, when a quartz substrate is used as a substrate having an insulting surface, the first gate insulting film of a semiconductor memory element may be formed by a thermally oxidizing step. For example, a thermally oxide film of 10 through 200 nm is formed by carrying out a heating treatment at 950° C. in an oxidizing atmosphere. Thereby, an oxide film having an excellent quality and a semiconductor/insulating film interface having a small interface state are provided and high reliability of the first gate insulting film is achieved. Further, the first gate insulating film may be constituted by a laminated structure of a laminated film and a thermally oxide film by carrying out the thermally oxidizing step after forming a silicon oxide film or a silicon oxynitride film.

Next, a resist mask (not illustrated) is formed, an impurity element providing n-type is selectively added, and an n-type impurity region 705 functioning as an overlapping region of a semiconductor memory element is formed. Doping is carried out by an ion doping method using phosphine $(PH_3)$ as a representative method. As the n-type impurity element, arsenic (As) may be used other than phosphor (P).

Next, as shown by FIG. 7 (B), gate electrodes 711, 712 and a floating gate electrode 713 are formed over the first gate insulting film 704. The gate electrodes 711, 712 and the floating gate electrode 713 may be formed by tantalum (Ta), titanium (Ti), molybdenum (Mo), tungsten (W), an alloy whose a major component is the above-described elements, or polycrystal silicon or the like.

Thereafter, an n-type impurity element and a p-type impurity element are respectively added self-adjustingly by constituting masks by the gate electrodes 711, 712 and the floating gate electrode 713 to thereby form high concentration n-type impurity regions 714 through 717 functioning as source regions or drain regions of n-channel type TFTs and high concentration p-type impurity regions 718, 719 functioning as a source region or a drain region of the p-channel type TFT. Phosphor (P) or arsenic (As) is used for the impurity element providing the n-type, and boron (B) is used for the impurity element for providing the p-type, respectively.

Next, as shown by FIG. 7 (C), a silicon oxide film or a silicon oxynitride film of 10 through 200 nm is formed by using a plasma CVD method or a sputtering method as a second gate insulating film 721. Further, a laminated film by $SiO_2/SiN/SiO_2$ (referred to as ONO film) may be used as the second gate insulating film 721.

Thereafter, the n-type or the p-type impurity element is activated. As activating means, a furnace annealing, a laser annealing, a lamp annealing, or a method constituted by combining these may be used. A thermal annealing method is carried out at 400 through 700° C. in a nitrogen atmosphere having an oxygen concentration equal to or smaller than 1 ppm, preferably, equal to or less than 0.1 ppm.

Next, a control gate electrode 722 is formed by forming and patterning a conductive film of 200 through 400 nm. The control gate electrode 722 may be formed by tantalum (Ta), titanium (Ti), molybdenum (Mo), tungsten (W), an alloy whose a major component is the above-described elements, or polycrystal silicon or the like.

Thereafter, as shown by FIG. 7 (D), an interlayer insulating film 723 by a silicon nitride film or a silicon oxynitride film is formed over the control gate electrode 722 and the second gate insulating film 721, the interlayer insulating film 723 is formed with contact holes and formed with source or drain wirings 724 through 728. Thereafter, by carrying out a heat treatment at 400 through 450° C., hydrogen included by the silicon nitride film or the silicon oxynitride film is discharged and the island-like semiconductor film can be hydrogenated.

In this way, as shown by FIG. 7 (D), the semiconductor memory element and the peripheral circuit comprising the n-channel type TFT and the p-channel type TFT can be simultaneously formed. By the fabricating steps, a publicly-known memory cell array of an NOR type, or an NAND type and the peripheral circuit comprising a CMOS circuit or a single electrode TFT can be fabricated.

Further, by the embodiment mode, not only the peripheral circuit but also every circuit comprising an n-channel type TFT and a p-channel type TFT can be fabricated. Particularly, CPU (Central Processor Unit) and various controllers can be simultaneously formed, and a pixel of a liquid crystal display apparatus or a light emitting apparatus and a driving circuit can be simultaneously formed.

Further, although according to the embodiment mode, an explanation has been given of a case of fabricating the single drain structure, a low concentration drain region may be arbitrarily provided by using a publicly-known method of a method of constituting a mask by a photoresist or the like.

In this way, the semiconductor memory element and TFT in which the surfaces of the activating layers are flat and very minute can be simultaneously formed over the substrate having the insulating surface. As a result, there can be realized the semiconductor memory device including the involatile memory which is highly reliable and small-sized and in which the memory cell array and the peripheral circuit are formed over the same substrate.

Embodiment 1

An explanation will be given of a circuit constitution and a method of operating an involatile memory as an embodiment of a semiconductor memory device according to the invention.

The invention is characterized in a structure and a semiconductor activating layer of a semiconductor memory element and a method of fabricating the same and a publicly-known technology can be used for a circuit constitution and a method of operating of a memory cell. According to the embodiment mode, a simple explanation will be given of a typical circuit constitution and a method of operating of an NOR type flash memory.

Figure 8:
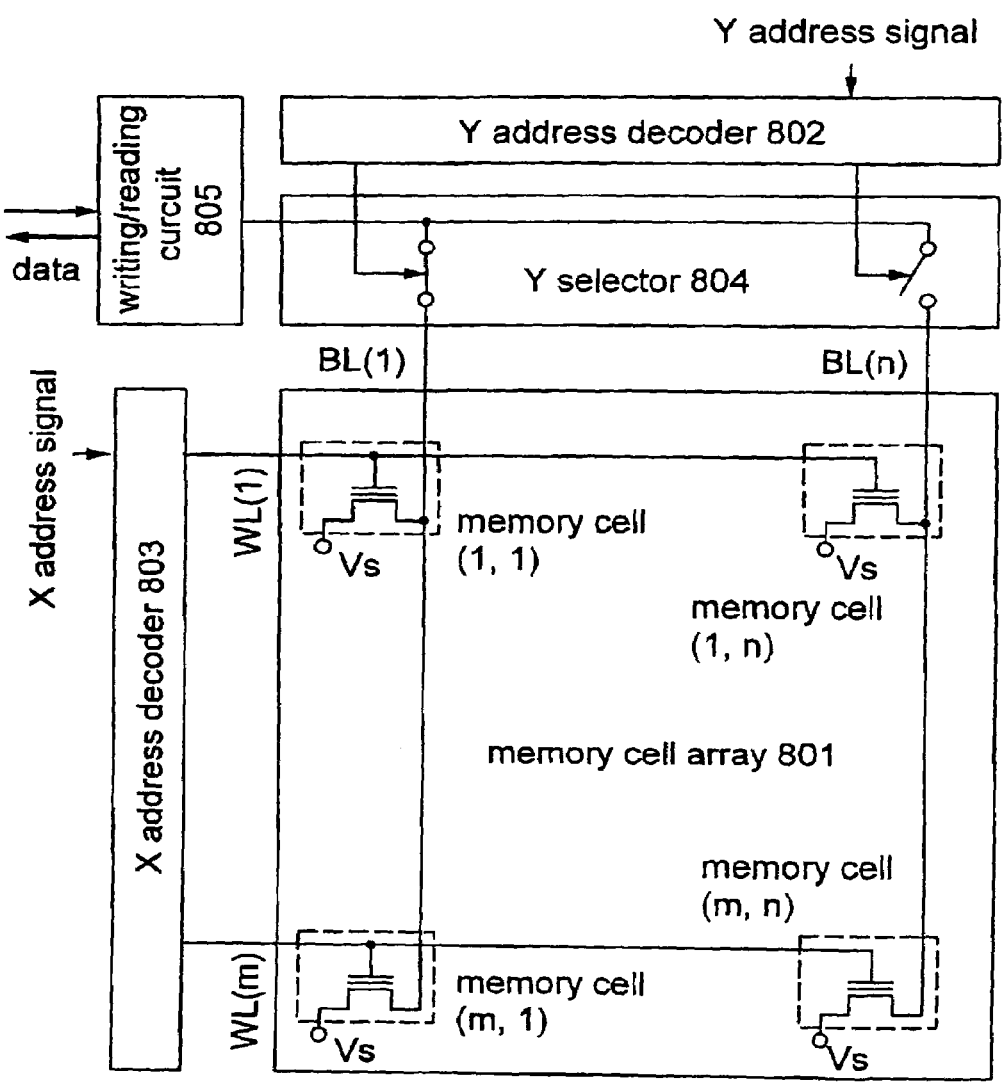
FIG. 8 is a block circuit diagram of an NOR type involatile memory.

FIG. 8 shows a block circuit diagram of an NOR type flash memory having a storage capacity of m×n bits. The NOR type flash memory shown in FIG. 8 is constituted by a memory cell array 801 arranged with a plurality of memory cells (1, 1) through (n, m) in a shape of a matrix of longitudinal m pieces×horizontal n pieces, and peripheral circuits of an X address decoder 803, a Y address decoder 802, a Y selector 804, and a writing/reading circuit 805. A voltage elevating circuit, an address buffer circuit or the like may be provided as other peripheral circuits.

Each memory cell (a memory cell (i, j) as a representative is considered. Here, i is an integer equal to or larger than 1 and equal to or smaller than n, j is an integer equal to or larger than 1 and equal to or smaller than m) is constituted by a semiconductor memory element of an n-channel type. Further, a drain electrode and a control gate electrode of the semiconductor memory element are respectively connected to a bit line BL (i) and a word line WL (j). Further, the bit lines BL (1) through BL (n) and the word lines WL (1) through WL (m) are respectively connected to the Y address decoder 802 and the X address decoder 803. Further, source electrodes of all the semiconductor memory element are connected to a common source line and are provided with a source line potential Vs.

Writing and reading of data is carried out by a memory cell selected by the X address decoder 803 and the Y address decoder 802. An explanation will be given of a writing operation and a reading operation by hot electrons by taking an example of the memory cell (1, 1).

First, when data is written to the semiconductor memory element, the source line is connected to GND and positive high voltage (for example, 16 V) is applied to the bit line BL (1) and the word line WL (1), respectively. Under such a condition, impact ion formation is brought about by a high electric field at a vicinity of a drain of the semiconductor memory element. Further, a high electric field is generated also in a gate direction and therefore, generated hot electrons are injected into the floating gate electrode to thereby carry out writing. Threshold voltage of the semiconductor memory element is changed in accordance with an amount of charge accumulated in the floating gate electrode.

When data stored to the semiconductor memory element is read, the source line is connected to GND and a predetermined voltage is applied to the word line WL (1). The predetermined voltage may be set between threshold voltage after writing and threshold voltage after erasing. As a result, data stored to the memory cell (1, 1) is read from the bit line BL (1) by utilizing the fact that only the erased semiconductor memory element is brought into ON state.

For example, when the threshold voltages in two states of the semiconductor memory element are respectively equal to or smaller than 2 V and equal to or larger than 4 V, 3 V can be used as a predetermined voltage.

Erasing of data is simultaneously carried out for a plurality of selected memory cells. For example, when a first column of the memory cells (1, 1) through (m, 1) are erased, the source lines and the word line W1 are connected to GND and positive high voltage (for example, 20 V) is applied to the bit line B1. At this occasion, a high potential difference is produced between the gate and the drain of the semiconductor memory element and therefore, electrons accumulated at the floating gate electrode are discharged to the drain region by tunnel current to erase. In this way, when charge is drawn from the drain region of the semiconductor memory element, it is preferable that the high concentration impurity region on the drain side and the floating gate electrode are partially overlapped via the first gate insulating film.

Further, all of potentials of the signal lines BL (2) through BL (n), WL (2) through WL (m) which are not selected in writing, reading and erasing may be set to 0 V. Further, the above-described values of operating voltages are only an example and the operating voltages are not limited to the values.

Further, although according to the embodiment, an explanation has been given of a case of storing information of two values (1 bit) to one semiconductor memory element, by further accurately controlling the threshold voltages, an involatile memory having a number of values for storing information of three or more values to one semiconductor memory element can be constituted. Further, the involatile memory may be an involatile memory of a type constituting a memory cell by one semiconductor memory element and one selecting TFT, or an involatile memory of a type constituting a memory cell by a semiconductor memory element having a split gate structure serving both as a selecting TFT and a semiconductor memory element.

Embodiment 2

According to the embodiment, an explanation will be given of an NAND type flash memory as an example which differs from the circuit constitution of the involatile memory shown in Embodiment 1.

Figure 9:
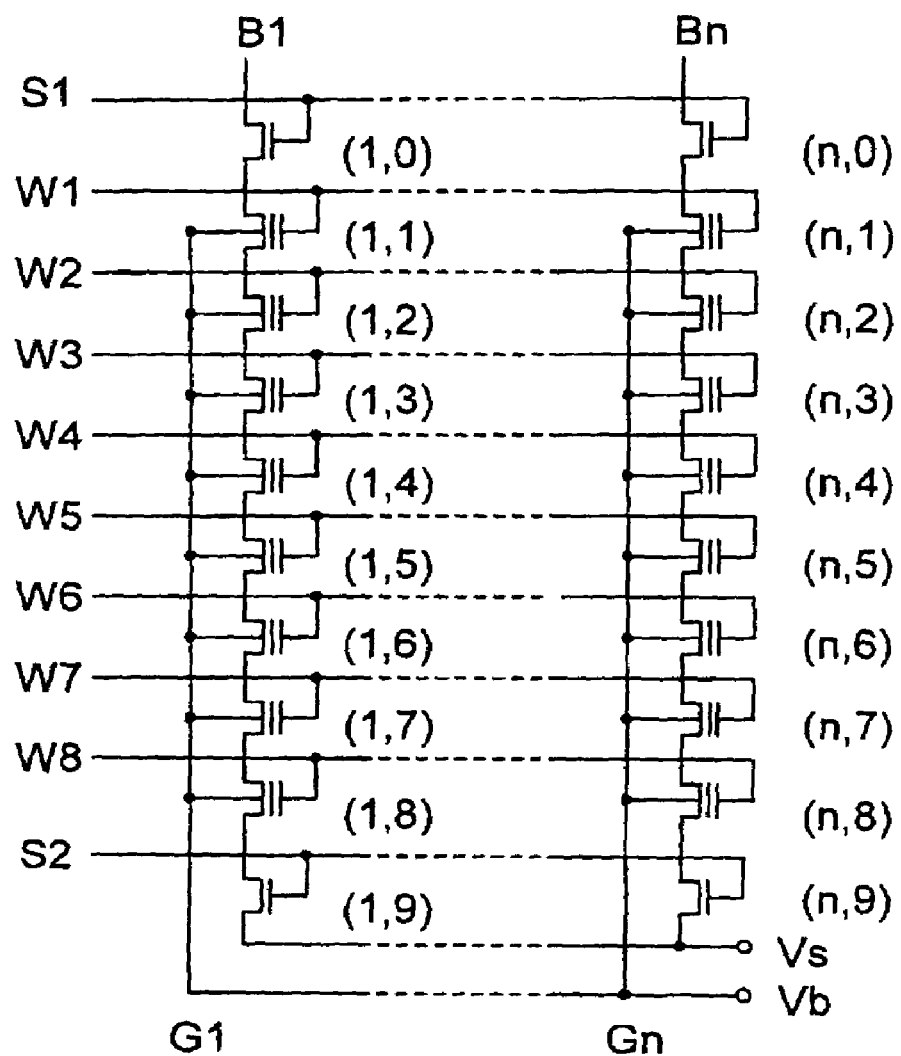
FIG. 9 is a block circuit diagram of an NAND type involatile memory.

FIG. 9 is a circuit diagram of a memory cell array of an NAND type aligned with n-channel type semiconductor memory elements in a shape of matrix of longitudinal 8 pieces×horizontal n pieces (only columns at both ends are illustrated).

In FIG. 8, 8 of semiconductor memory elements (i, 1) through (i, 8) (i=1 through n) arranged on the same column are connected in series and channel forming regions thereof are connected to a wiring Gi. The wirings G1 through Gn constitute common wirings and are applied with a potential Vb. Further, in n pieces of the semiconductor memory elements (1, j) through (n, j) (j=1 through 8) arranged on the same row, control gate electrodes thereof are connected to the word line Wj.

Selecting TFTs (i, 0) and (i, 9) are connected in series with both ends of 8 of the semiconductor memory elements (i, 1) through (i, 8) (i=1 through n) connected in series. Further, a remaining one of a source electrode and the drain electrode of the selecting TFT (i, 0) is connected with a bit line B1 and a gate electrode thereof is connected with a selecting gate line S1. Further, a remaining one of the source electrode and the drain electrode of a selecting TFT (i, 9) is applied with a common source potential Vs and a gate electrode thereof is connected with a selecting gate line S2.

A method of operating the NAND type flash memory will be described. An explanation will be given here of a method of erasing in a lump sum by tunnel current and simultaneously writing of one row by tunnel current.

According to the embodiment, a state of "0" indicates a state in which charge is injected to the floating gate electrode of the semiconductor memory element, and a state of "1" indicates a state in which charge is discharged from the floating gate electrode of the semiconductor memory element. Further, threshold voltage of the semiconductor memory element in the state of "0" is made to be 0.5 V through 3 V and threshold voltage of the semiconductor memory element in the state of "1" is made to be equal to or smaller than −1 V.

First, simultaneously writing of one row will be described. As a specific example, simultaneously writing of a first row is considered, and an explanation will be given of a case of writing "0" to the semiconductor memory element (1, 1) and "1" to the semiconductor memory elements (2, 1) through (n, 1). Further, immediately before writing, all of the semiconductor memory elements are brought into a state of "1". First, the potential Vb and the source potential Vs are connected to GND. Further, the selecting gate lines S1, S2 are respectively applied with 20 V, 0 V, the selecting TFTs (1, 0) through (n, 0) are brought into an ON state, and the selecting TFTs (1, 9) through (n, 9) are brought into an OFF state. Further, 20 V is applied to te word line W1, 7 V is applied to the word lines W2 through W8, 0 V is applied to the bit line B1, and 7 V is applied to the bit lines B2 through Bn.

As a result, a high voltage (about 20 V) is applied only to between the floating gate electrode—channel forming region of the semiconductor memory element (1, 1) and charge is injected to the floating gate electrode by tunnel current. That is, "0" is written thereto. Further, a potential difference of about 14 V is only produced between the floating gate electrodes—channel forming regions of the semiconductor memory elements (2, 1) through (n, 1) and charge is not injected to the floating gate electrodes by tunnel current. That is, the semiconductor memory elements (2, 1) through (n, 1) stay to be in the state of "1". Further, also with regard to the semiconductor memory elements at other than the first row, a potential difference of at most 7 V is produced between the floating gate electrodes—channel forming regions and charge is not injected to the floating gate electrodes. In this way, simultaneously writing of one row is carried out.

When reading is carried out from the semiconductor memory element (1, 1), first, the potential Vb is connected to GND and 0 V is applied to the word line W1 and 5 V is applied to the word lines W2 through W8. Thereby, all of the semiconductor memory elements from the second row to the eighth row are brought into the ON state. Further, the semiconductor memory elements at the first row are brought into the ON state when the semiconductor memory elements at the first row have been in the state of "1" and brought into the OFF state when the semiconductor memory elements at the first row have been brought into the state of "0". That is, conduction and nonconduction of the eight semiconductor memory elements connected in series is determined by the state of the semiconductor memory element at the first row. Further, by applying 5 V to the selecting gate lines S1, S2 to bring the selecting TFTs into the ON state and connecting the source potential Vs to GND, data can be read from the semiconductor memory element (1, 1) via the bit line B1.

When an erasure is carried out in a lump sum, all of the word lines W1 through W8 are made to be 0 V and the potential Vb is made to be 20 V. As a result, high voltage is applied between the floating gate electrodes—channel forming regions and an erasure by tunnel current is carried out. Further, although the potential of the selecting gate line may be freely determined, it is preferable to apply a voltage to the degree the same as that of the potential Vb such that a strong electric field is not generated in the gate oxide film.

Further, the above-described values of operating voltages are only an example and the operating voltages are not limited to the values. Further, although according to the embodiment, an explanation has been given of the memory cell array of longitudinal 8 pieces×horizontal n pieces, the memory cell array needs not to be limited to the constitution.

The invention is also applicable to such an NAND type flash memory and a highly reliable and small-sized memory can be realized.

Embodiment 3

According to the embodiment, an example of a constitution of the laser processing apparatus capable of being applied in crystallization is shown.

Figure 10:
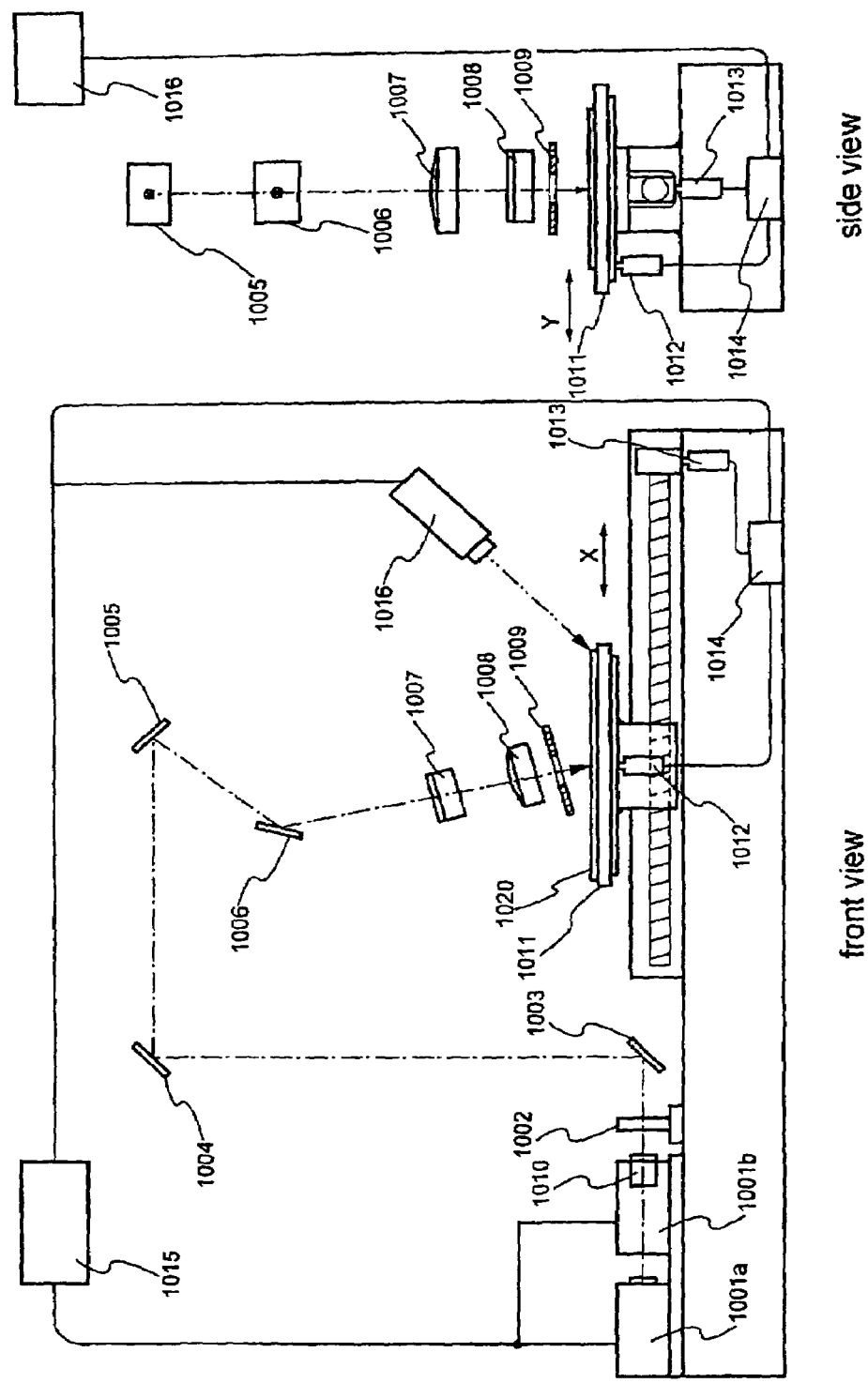
FIG. 10 is an arrangement view showing a mode of a laser irradiating apparatus applied to the invention.

FIG. 10 shows a constitution of a laser processing apparatus comprising laser oscillating apparatuses 1001a, 1001b, a shutter 1002, high conversion mirrors 1003 through 1006, cylindrical lenses 1008, 1009, a slit 1007, a mounting base 1011, driving means 1012, 1013 for displacing the mounting base 1011 in X direction and in Y direction, a controlling mean 1014 for controlling the driving means, and an information processing mean 1015 for transmitting signals to the laser oscillating apparatus 1001 and the controlling mean 1014 and the like based on the program stored in advance by a front view and a side view.

The laser oscillating apparatus is applied with a rectangular beam solid laser oscillating apparatus, particularly preferably, applied with a slab laser oscillating apparatus. Or a laser oscillating apparatus may be constituted by combining a solid laser oscillating apparatus using a crystal constituted by doping Nd, Tm, Ho to a crystal of YAG, YVO$_4$, YLF, YAIO$_3$ or the like and a slab structure amplifier. As a slab material, there is used a crystal of Nd:YAG, Nd:GGG (gadolinium, gallium, garnet), Nd: GSGG (gadolinium, scandium, gallium, garnet) or the like. Other than these, a gas laser oscillating apparatus, a solid laser oscillating apparatus capable of oscillating continuously can be applied thereto. The continuously oscillating solid laser oscillating apparatus is applied with a laser oscillating apparatus using a crystal constituted by doping Cr, Nd, Er, Ho, Ce, Co, Ti or Tm to a crystal of YAG, YVO$_4$, YLF, YAIO$_3$. Although a basic wave of an oscillating wavelength differs by a doping material, oscillation is carried out by a wavelength of from 1 µm to 2 µm. In order to achieve a higher output equal to or higher than 5 W, diode-excited solid laser oscillating apparatus may be connected by cascade connection.

Laser beam in a circular shape or a rectangular shape outputted from such a laser oscillating apparatus is linearly focused in a sectional shape of an irradiating surface by the cylindrical lenses 1008, 1009. Further, in order to prevent interference at the irradiating surface, there is constructed a constitution of being incident from a skewed direction by an angle of 10 through 80 degrees by adjusting the high conversion mirrors arbitrarily. When the cylindrical lenses 1008, 1009 are made of synthesized quartz, a high transmittance is achieved, and coatings applied to surfaces of the lenses are applied for realizing 99% or more of a transmittance with respect to a wavelength of laser beam. Naturally, the sectional shape of the irradiating surface is not limited to the linear shape but may be constituted by an arbitrary shape of a rectangular shape, an elliptical shape, an oval shape or the like.

Further, it is preferable that a wavelength of a continuously oscillating laser beam is 400 through 700 nm in consideration of an absorption coefficient of a semiconductor film. Beam in such a wavelength band is provided by outputting second harmonic through fourth harmonic of a basic wave by using a wavelength conversion element 1010. The wavelength conversion element is applied with ADP (ammonium dihydrogenated phosphate), Ba$_2$NaNb$_5$O$_{15}$ (barium sodium niobate), CdSe (cadmium selenide), KDP (potassium dihydrogen phosphate), LiNbO$_3$ (lithium niobate), Se, Te, LBO (LiB$_3$O$_5$), BBO (β-BaB$_2$O$_4$), KB$_5$ or the like. It is particularly preferable to use LBO.

Laser processing of a substrate 1020 is made to be able to carry out by moving the mounting base 1011 in two axes directions by the driving means 1012, 1013. In moving the mounting base 1011 in one direction, the mounting base 1011 can be moved over a distance longer than a length of one side of the substrate 1020 continuously by an equal speed of 1 through 200 cm/sec, preferably, 5 through 50 cm/sec and in moving in the other direction, the mounting base 1011 can be moved over a distance to a degree the same as that in a longitudinal direction of the linear beam discontinuously step by step. The mounting base 1011 is operated in synchronism with oscillation of the laser oscillating apparatus 1001a, 1001b by the information processing mean 1015 mounted with a microprocessor.

By linearly moving the mounting base 1011 in X direction shown in the drawing, an entire surface of the substrate can be processed by laser beam irradiated from a fixed optical system. A position detecting mean 1016 detects that the substrate 1020 is disposed at a position of irradiating laser beam and transmits the signal to the information processing mean 1015 to synchronize a timing of oscillating operation of the laser oscillating apparatus 1001a, 1001b by the information processing mean 1015. That is, when the substrate 1020 is not disposed at the position of irradiating laser beam, oscillation of laser is stopped to prolong life thereof.

Laser beam irradiated to the substrate 1020 by the laser irradiating apparatus having such a constitution can process a desired region or an entire surface of the semiconductor film by being moved relatively in X direction or Y direction shown in the drawing.

Further, the embodiment can be freely combined with either constitution of Embodiments 1, 2.

Embodiment 4

According to the embodiment, an explanation will be given of a mode of fabricating an IC chip by forming and transcribing a semiconductor memory element and TFT by using a polycrystal semiconductor film crystallized by continuously oscillating laser beam, or a mode of transcribing the semiconductor memory element and TFT over a plastic substrate.

First, a metal film is formed over a first substrate having an insulating surface by using a sputtering method. In this case, tungsten is used for the metal film and a film thickness thereof is set to 10 nm through 200 nm, preferably, 50 nm through 75 nm. Further, although according to the embodiment, the metal film is directly formed over the first substrate, the metal film may be formed after covering the first substrate with an insulating film of silicon oxide, silicon nitride, silicon oxynitride or the like.

Further, after forming the metal film, a surface of the metal is oxidized to form a metal oxide film and an oxide film is formed. According to the embodiment, as the metal oxide film, tungsten oxide is formed by several nm by a presputtering method and as the oxide film, a silicon oxide film is formed to constitute a film thickness of 150 nm through 300 nm. The series of steps are carried out by using a sputtering apparatus without exposing to the atmosphere.

Next, a base film is formed by using a plasma CVD method. After the step, a polycrystal semiconductor film having an island-like shape in which a surface is flat can be formed by the fabricating method explained in Embodiment Mode 1.

Figure 14:
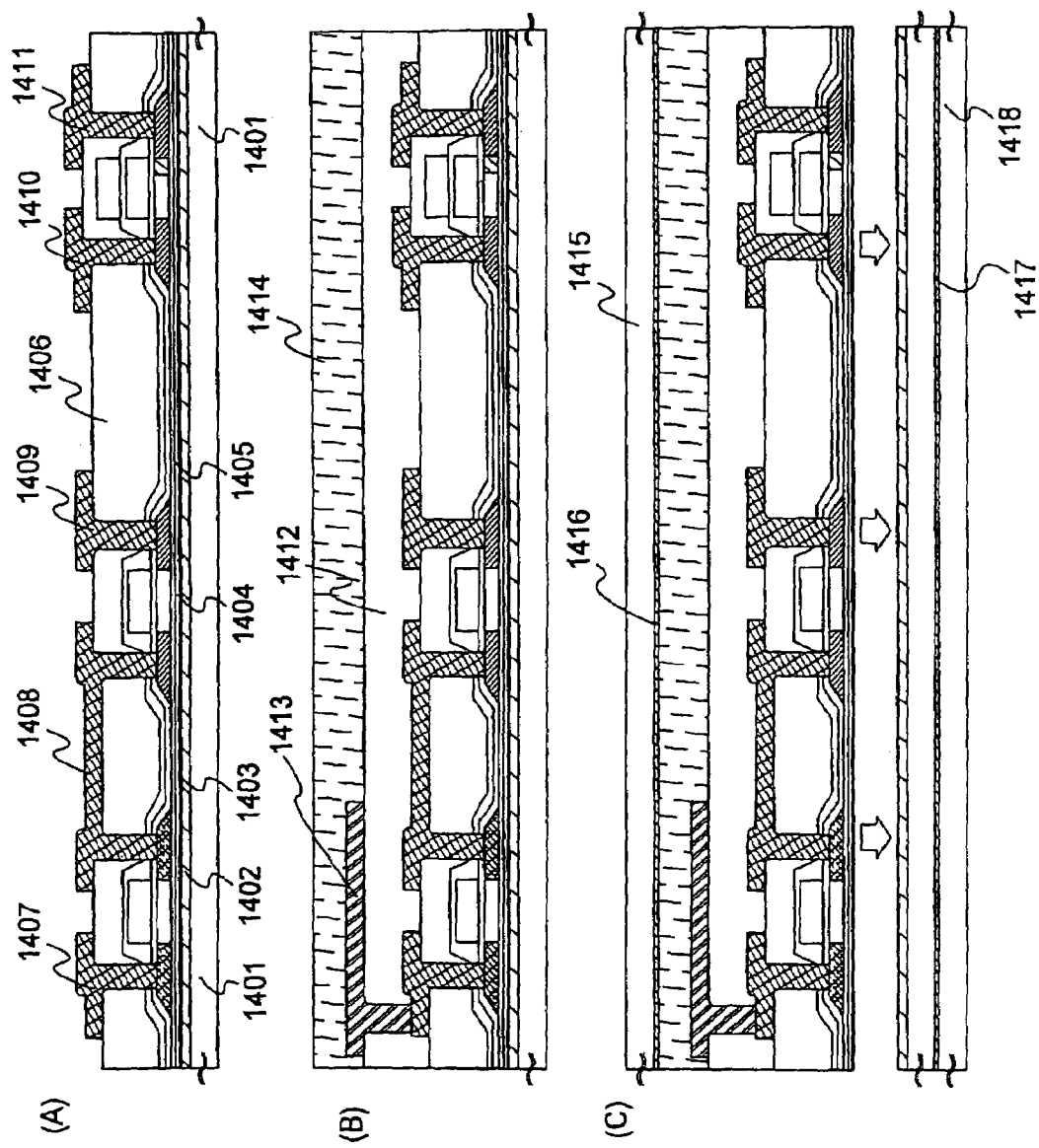
FIGS. 14A-14C are sectional views for explaining a method of fabricating a semiconductor memory element according to the invention.

Further, the semiconductor memory element and TFT can be fabricated as shown by FIG. 14 (A) in accordance with the fabricating method explained in Embodiment Mode 2.

In reference to FIG. 14 (A), a metal film 1402, a metal oxide film 1403, an oxide film 1404, and a base film 1405 are laminated over a substrate 1401 having an insulating surface, and a semiconductor memory element and TFT and wirings 1407 through 1411 are formed thereover. Further, a method of fabricating TFT is not limited to steps shown in Embodiment Mode 2.

Next, as shown by FIG. 14 (B), after forming a second interlayer insulating film 1412, a contact hole is formed and a pad 1413 connected to the wiring 1407 via the contact hole is formed. Further, a mode of electrically connecting the pad 1413 and TFT is not limited to the embodiment.

Next, a protecting layer 1414 is formed over the second interlayer insulting film 1412 and the pad 1413. The protecting layer 1414 uses a material capable of protecting surfaces of the second interlayer insulating film 1412 and the pad 1413 when a second substrate is made to paste thereon or exfoliate therefrom and capable of being removed after exfoliating the second substrate. For example, the protecting layer 1414 can be formed by coating a resin of epoxy species, acrylate species, or silicone species soluble to water or alcohols over an entire surface thereof to bake.

Next, the metal oxide film 1403 is crystallized to facilitate to exfoliate at later stage. By the crystallization, the metal oxide film 1403 is easy to crack at a grain boundary to be able to promote brittleness. According to the embodiment mode, the crystallization is carried out by carrying out a heating treatment approximately at 400° C. through 550° C. for 0.5 through 5 hours.

Next, there is carried out a processing of forming a portion constituting an onset of starting exfoliation by partially deteriorating adherence between the metal oxide film 1403 and the oxide film 1404, or adherence between the metal oxide film 1403 and the metal film 1402. Specifically, laser beam is partially irradiated to the metal oxide film 1403 along a peripheral border of a region intended to exfoliate, or a pressure is locally applied from outside along the peripheral border of the region intended to exfoliate to damage inside of a layer or a partially vicinity of an interface of the metal oxide film 1403. For example, a scriber apparatus may be used to move by constituting a pressing amount by 0.1 mm through 2 mm and applying a pressure thereon.

Next, as shown by FIG. 14 (C), a second substrate 1415 is pasted over the protecting layer 1414 by using a two-sided tape 1416, and a third substrate 1418 and the first substrate 1401 are pasted by using a two-sided tape 1417. The third substrate 1418 prevents the first substrate 1401 from being damaged at a later exfoliating step. It is preferable to use a substrate having rigidity higher than that of the first substrate 1401, for example, a quartz substrate, or a semiconductor substrate for the second substrate 1415 and the third substrate 1418.

Next, the metal film 1402 and the oxide film 1404 are physically exfoliated. Exfoliation is started at the region of the metal oxide film 1403 in which adherence to the metal film 1402 or the oxide film 1404 is partially deteriorated in a foregoing step. Further, a side of the second substrate 1415 pasted with the semiconductor element as it is separated from a side of the third substrate 1418 pasted with the first substrate 1401 and the metal film 1402 as they are, respectively. Exfoliation can be carried out by a comparatively small force (for example, the hand of a person, wind pressure of a gas blown from a nozzle, ultrasonic wave or the like). Further, the metal oxide film 1403 and the oxide film 1404 are adhered to the side of the second substrate 1415 or the side of the third substrate 1418.

The semiconductor memory element and TFT prepared in this way are pasted to various substrates to remove the second substrate 1415 to thereby enable to transcribe the semiconductor element.

Figure 15:
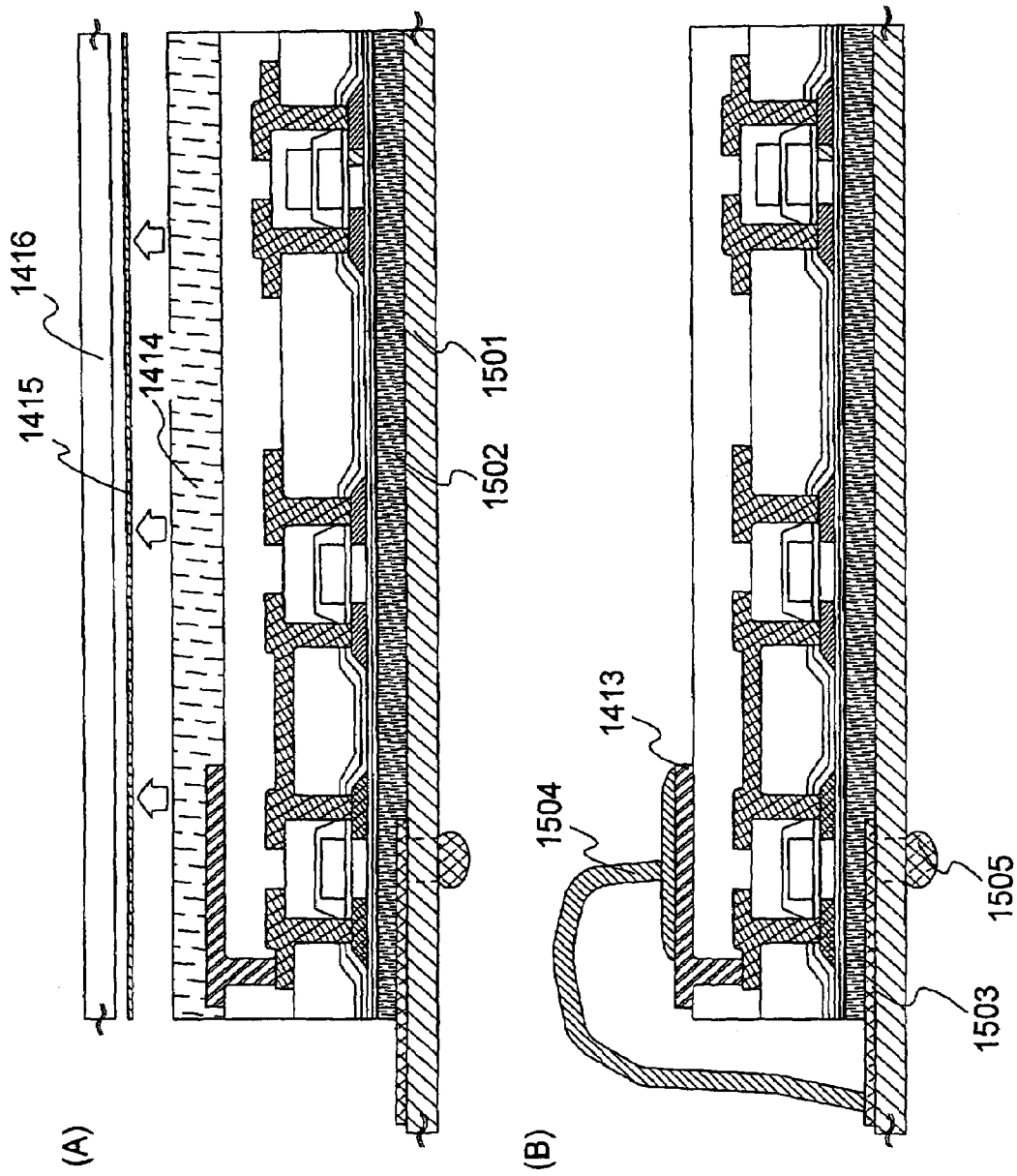
FIGS. 15A-15B are sectional views for explaining a method of fabricating a semiconductor memory element according to the invention.

For example, in the case of fabricating an IC chip, as shown by FIG. 15 (A), an interposer (printed wiring substrate) 1501 and the second substrate 1415 pasted with the semiconductor memory element and TFT are adhered by an adhesive agent 1502 and the two-sided tape 1416 and the second substrate 1415 are exfoliated from the protecting layer 1414 successively or simultaneously.

Further, as shown by FIG. 15 (B), the protecting layer 1414 is removed, and the pad 1413 and a terminal 1503 is connected by a wire 1504 by using a wire bonding method to finish a package. Further, a water-soluble resin is used for the protecting layer 1414 and therefore, the protection layer 1414 can be removed by being dissolved in water. Further, a cleaning processing or an $O_2$ plasma processing may be added to a surface of the electrode as necessary.

A publicly-known material of a ceramics substrate, a glass epoxy substrate, a polyimide substrate or the like can be used for the interposer 1501. Further, as the adhesive agent 1502, various curing type adhesive agents of a reaction curing type adhesive agent, a thermosetting type adhesive agent, and an optically curing type adhesive agent of an ultraviolet ray cuing type adhesive agent or the like, and an anaerobic type adhesive agent and the like are given.

Further, although according to the embodiment, an interposer of a ball grid array type provided with a solder ball 1505 is used, the invention is not limited thereto. An interposer of a lead frame type arranged with terminals at a periphery thereof may be used.

Although according to the embodiment, an explanation has been given of an example of a package by CSP (Chip Sized Package), the invention is not limited thereto. Further, other chips can be laminated or arranged in parallel and packaging by MCP (Multi chip Package) can be also carried out.

Transcription to a plastic substrate can be similarly carried out.

First, a plastic substrate and the second substrate 1415 pasted with a semiconductor memory element and TFT are adhered by an adhesive agent, the two-sided tape 1416 and the second substrate 1415 are exfoliated from the protecting layer 1414 successively or simultaneously. Further, transcription onto the plastic substrate is finished by removing the protecting layer 1414.

As the plastic substrate, it is preferable to use a plastic substrate having a high thermal conductivity of 2 through 30 W/mK. It is preferable to use a plastic substrate in which ceramics and lead free solder are mixed with a synthetic resin comprising polypropylene, polypropylene sulphide, polycarbonate, polyetherimide, polyphenylene sulphide, polyphenylene oxide, polysulfon, or polyphthalamide and intervals among particles of ceramics are connected as in a network.

The IC chip can be fabricated or transcribed over a plastic substrate by forming a semiconductor memory element and TFT by using a polycrystal semiconductor film crystallized by continuously oscillating laser beam to transcribe.

As the IC chip, particularly by constituting a laminated type by MCP, a small-sized and large capacity involatile memory chip can be fabricated when a plurality of involatile memory chips are laminated, and a small-sized multifunction involatile memory chip can be fabricated when an involatile memory chip and other IC chips are laminated, respectively. Further, by forming the chip over the plastic substrate, there is achieved an advantage of being stouter and more lightweight than a semiconductor substrate or a glass substrate. Further, when the substrate is a substrate having excellent heat discharging performance, the substrate is a mode which is improved against heat generation of a circuit and is preferable.

Further, the embodiment can be freely combined with any constitution of the Embodiments 1 through 3.

Embodiment 5

An explanation will be given of a case of an example of a semiconductor memory device of the invention which is applied to a microprocessor of an RISC (Reduced Instruction Set Computer) processor, an ASIC (Application Specified IC) processor or the like in which an involatile memory is integrated over one chip.

Figure 11:
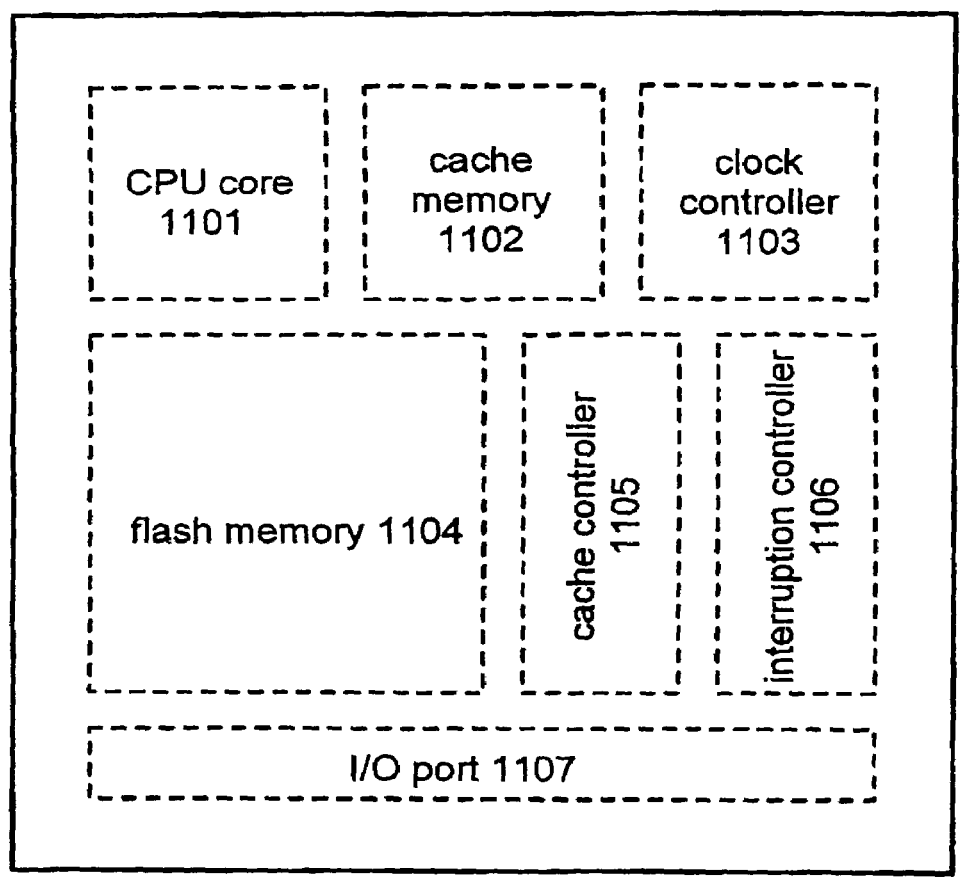
FIG. 11 is a diagram showing an example of a microprocessor.

FIG. 11 shows an example of a microprocessor. The microprocessor is typically constituted by a CPU core 1101, a flash memory 1104, a clock controller 1103, a cache memory 1102, a cache controller 1105, an interruption controller 1106, an I/O port 1107 and the like. Naturally, the microprocessor shown in FIG. 11 is a simplified example and various circuit designs are carried out for an actual microprocessor depending on use thereof.

The microprocessor shown in FIG. 11 can be fabricated by a fabricating method shown in the embodiment mode. A semiconductor memory element of the invention is used for a memory cell of the flash memory 1104, and respective blocks starting from a peripheral circuit and the CPU core 1101 are constituted by an n-channel type TFT and a p-channel type TFT formed simultaneously with the semiconductor memory element. As a cache memory, for example, SRAM is used.

By applying the invention to a microprocessor, a semiconductor memory device having a highly reliable small-area (or large capacity) involatile memory can be realized.

Further, the embodiment can be combined with any constitution of Embodiment Modes and Embodiments 1 through 4.

Embodiment 6

According to the embodiment, an explanation will be given of an example of a semiconductor memory device in a mode of a system on panel integrally formed with an image display portion (representatively, liquid crystal display portion or EL display portion), an involatile memory, and other semiconductor integrated circuits over a substrate having an insulating surface in reference to FIG. 12.

Figure 12:
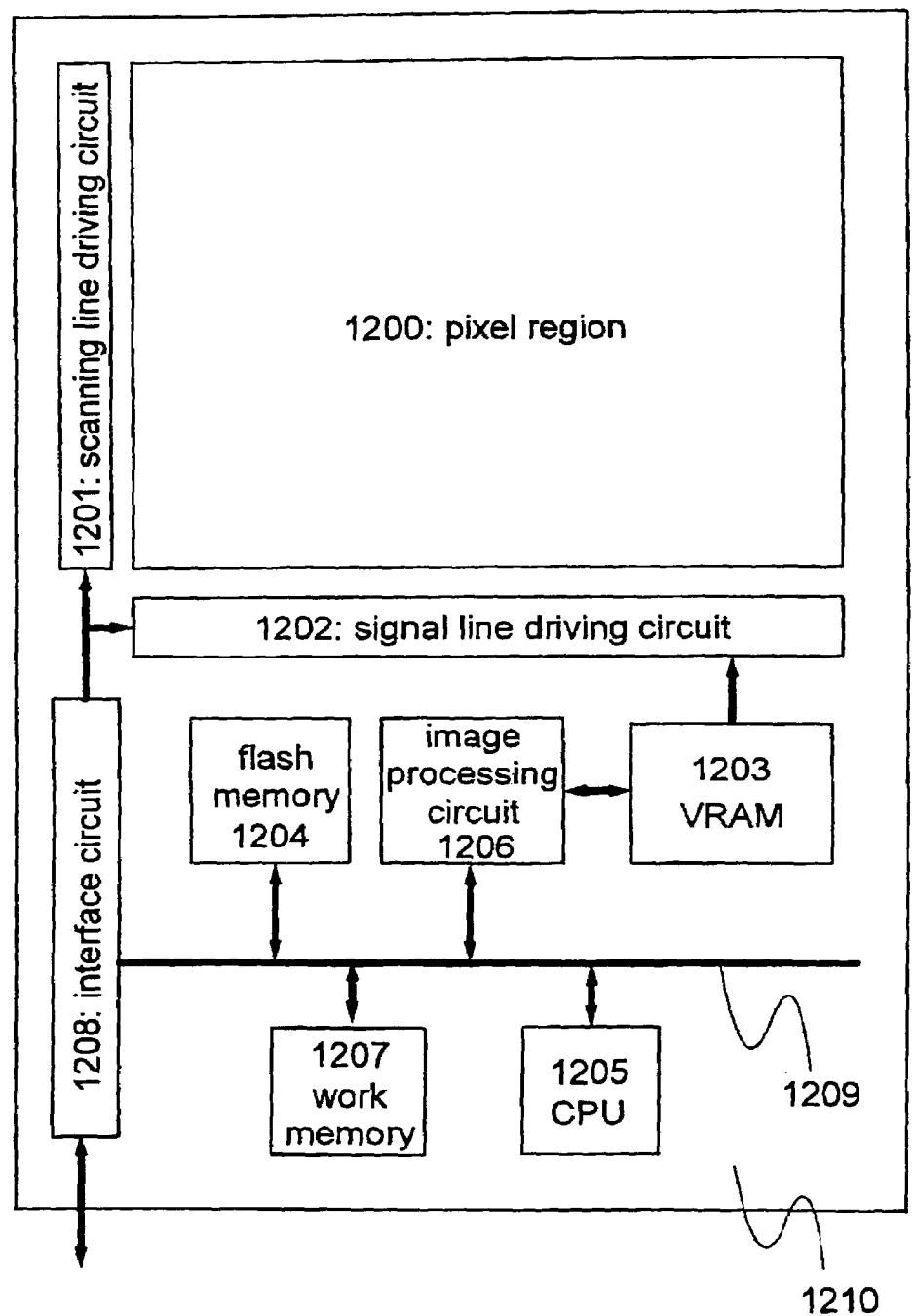
FIG. 12 is a diagram showing an example of a semiconductor memory device.

In FIG. 12, the semiconductor memory device is integrally formed with a pixel region 1200, a scanning line driving circuit 1201, a signal line driving circuit 1202, a VRAM 1203, a flash memory 1204, a CPU 1205, an image processing circuit 1206, a work memory 1207, and an interface circuit 1208 on a substrate 1210 having an insulating surface.

The semiconductor memory device shown in FIG. 12 is a device for inputting or fabricating image data to process the image data and subject the image data to format conversion and displaying an image. As the semiconductor memory device, for example, a video camera, a car navigation, a PDA, a game machine or the like is conceivable.

The semiconductor memory device receives data constituting a basis of image data from an input terminal in accordance with respective modes. For example, a signal may be directly inputted from an external terminal, or an input data may be inputted from an interface with a DV tape or a memory card. Other than these, an input signal from a keyboard or other control signal is inputted from the input terminal. Data constituting a basis of an inputted image is stored to the flash memory 1204 or temporarily stored to the work memory 1207 via a system bus, or converted into an image signal by the image processing circuit 1206 and stored to a VRAM. In the image processing circuit 1206, a decoding processing of image data formed into a compressed code in accordance with MPEG standards, a tape format or the like, an image signal processing of interpolation or resizing of an image are carried out. Further, the inputted control signal is used for controlling a CPU and the image processing circuit and further inputted to the signal line driving circuit and the scanning line driving circuit.

The CPU 1205 controls the flash memory 1204, the work memory 1207, the interface circuit 1208 and other circuits. Further, the CPU forms or processes data constituting a basis of image data. The flash memory 1204 is used as a memory region for storing color data or character data needed when the image data is formed or processed, or a memory region stored such as a program in starting the system. The work memory 1207 is used as a memory region for storing image data or data constituting a basis thereof, a work memory region of the CPU or the like and DRAM or SRAM is used.

An image display portion constituted by the signal line driving circuit 1202, the scanning line driving circuit 1201 and the pixel region 1200 is a region for displaying an image. The signal line driving circuit 1202 and the scanning line driving circuit 1201 are inputted with a control signal from outside via the interface circuit, and the signal line driving circuit 1202 loads image data outputted from the image processing circuit 1206 and stored to the VRAM in accordance with the control signal and displays an image in the pixel region.

The semiconductor memory device shown in FIG. 12 can be fabricated by the fabricating method shown in the embodiment mode. The semiconductor memory element according to the invention is used for a memory cell of the flash memory 1204, and respective blocks starting from the peripheral circuit and the CPU 1205 are constituted by n-channel type TFTs and p-channel type TFTs formed simultaneously with the semiconductor memory element.

By applying the invention to the semiconductor memory device in this way, a semiconductor memory device having a highly reliable and small area (or large capacity) involatile memory can be realized.

Further, the image display portion constituted by the signal line driving circuit 1202, the scanning line driving circuit 1201 and the image region 1200 and the image processing portion constituted by other circuits may be fabricated on different substrates, and naturally, the above-described semiconductor memory device can be realized by mounting a plurality of substrates.

Further, by forming the semiconductor memory device integrally with the pixel region, an effect of a small-sized formation and a reduction in power consumption and cost is achieved.

The embodiment can be used by being combined with Embodiments 1 through 4.

Embodiment 7

Figure 13:
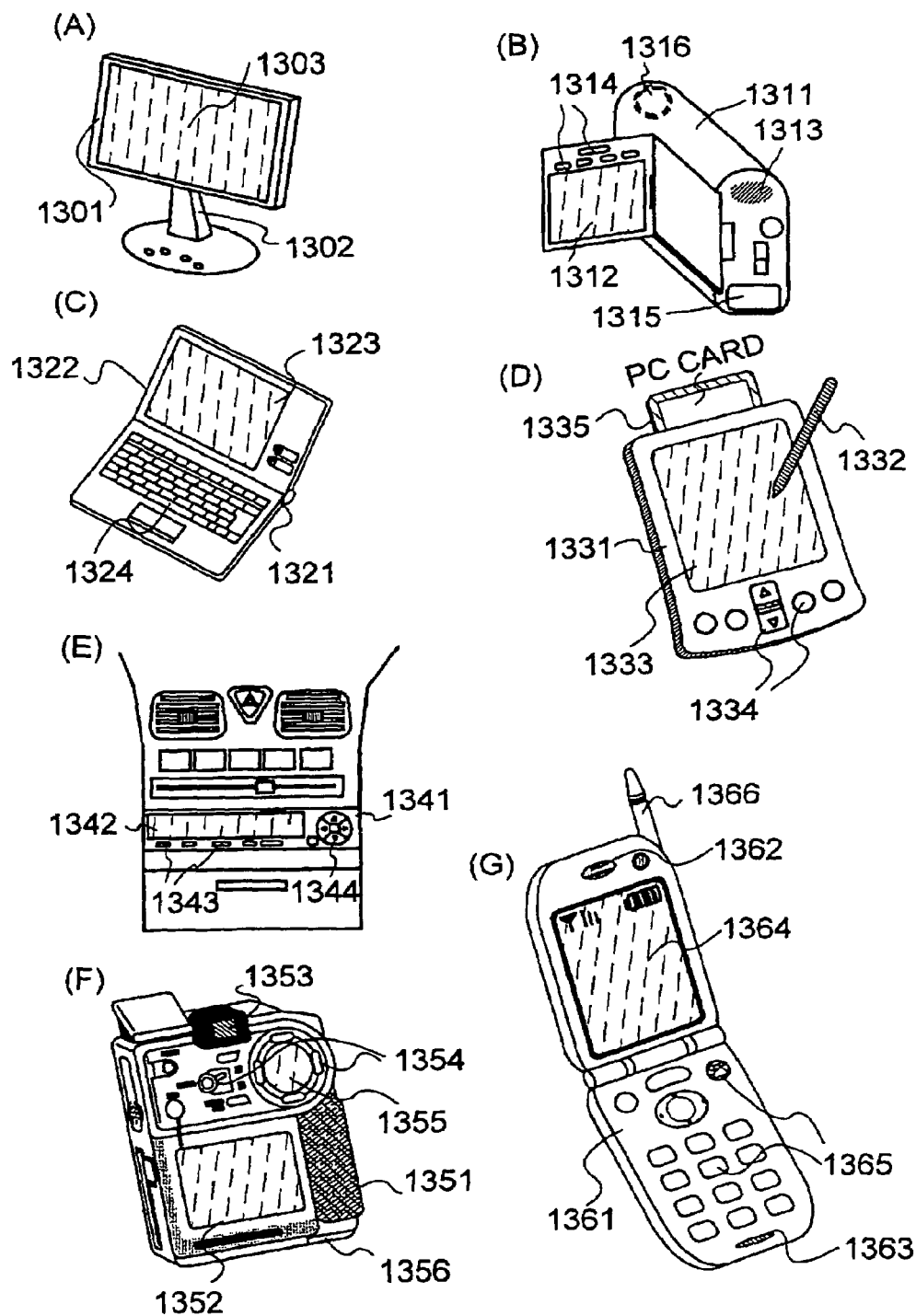
FIGS. 13A-13G are views showing an example of a semiconductor memory device.

According to the present invention, various semiconductor devices can be finished. An example thereof includes a portable information terminal (electronic notebook, mobile computer, mobile telephone, and the like), a video camera, a digital camera, a personal computer, a television monitor, and the like. FIG. 13 shows an example of these devices.

FIG. 13 (A) shows an example of application of the present invention to a television monitor, which is composed of a housing 1301, a supporting base 1302, a display portion 1303, and the like. A television monitor having a built-in small-sized and highly reliable involatile memory can be obtained by mounting an involatile memory fabricated by the present invention.

FIG. 13 (B) shows an example of application of the present invention to a video camera, which is composed of a main body 1311, a display portion 1312, an audio input portion 1313, operation switches 1314, a battery 1315, an image receiving portion 1316, and the like. A video camera having a built-in small-sized and highly reliable involatile memory can be obtained by mounting an involatile memory fabricated by the present invention.

FIG. 13 (C) shows an example of application of the present invention to a laptop computer, which is composed of a main body 1321, a housing 1322, a display portion 1323, a keyboard 1324, and the like. A personal computer having a built-in small-sized and highly reliable involatile memory can be obtained by mounting an involatile memory fabricated by the present invention.

FIG. 13 (D) shows an example of application of the present invention to a PDA (Personal Digital Assistant), which is composed of a main body 1331, a stylus 1332, a display portion 1333, operation buttons 1334, an external interface 1335, and the like. A PDA having a built-in small-sized and highly reliable involatile memory can be obtained by mounting an involatile memory fabricated by the present invention.

FIG. 13 (E) shows an example of application of the present invention to an audio reproduction device, specifically, an on-vehicle audio device, which is composed of a main body 1341, a display portion 1342, operation switches 1343 and 1344, and the like. An audio device having a built-in small-sized and highly reliable involatile memory can be obtained by mounting an involatile memory fabricated by the present invention.

FIG. 13 (F) shows an example of application of the present invention to a digital camera, which is composed of a main body 1351, a display portion (A) 1352, an eye piece portion 1353, operation switches 1354, a display portion (B) 1355, a battery 1356, and the like. A digital camera having a built-in small-sized and highly reliable involatile memory can be obtained by mounting an involatile memory fabricated by the present invention.

FIG. 13 (G) shows an example of application of the present invention to a mobile phone, which is composed of a main body 1361, an audio output portion 1362, an audio input portion 1363, a display portion 1364, operation switches 1365, an antenna 1366, and the like. A mobile phone having a built-in small-sized and highly reliable involatile memory can be obtained by mounting an involatile memory fabricated by the present invention.

Note that, the devices shown here are merely examples and the present invention is not limited to these applications.

The embodiment can be used by being combined with Embodiments 1 through 6.

What is claimed is:

1. A nonvolatile memory comprising a semiconductor memory element, said semiconductor memory element comprising:
   a semiconductor active layer comprising a channel region and one conductive type impurity region;
   a first insulating film;
   a charge accumulating layer;
   a second insulating film; and
   a control gate electrode,
   wherein the nonvolatile memory is formed over a substrate having an insulating surface;
   wherein the channel region is a polycrystal semiconductor film crystallized by being irradiated with continuously oscillating laser;
   wherein the semiconductor active layer is constituted by aggregating a plurality of crystal grains elongated in the same direction, and
   wherein a surface roughness of the channel region is 0.1 nm through 60 nm in a P-V value.

2. A nonvolatile memory comprising a semiconductor memory element, said semiconductor memory element comprising:
   a semiconductor active layer comprising a channel region and one conductive type impurity region;
   a first insulating film;
   a charge accumulating layer;
   a second insulating film; and
   a control gate electrode,
   wherein the nonvolatile memory is formed over a substrate having an insulating surface; and
   wherein a surface roughness of the channel region is 0.1 nm through 60 nm in a P-V value.

3. A nonvolatile memory comprising a semiconductor memory element, said semiconductor memory element comprising:
   a semiconductor active layer comprising a channel region and one conductive type impurity region;
   a first insulating film;
   a charge accumulating layer;
   a second insulating film; and
   a control gate electrode,
   wherein the nonvolatile memory is formed over a substrate having an insulating surface; and
   wherein a surface roughness of the channel region is 0.1 nm through 5 nm in an rms value.

4. The nonvolatile memory according to claim 1, wherein the semiconductor active layer comprises silicon.

5. The nonvolatile memory according to claim 2, wherein the semiconductor active layer comprises silicon.

6. The nonvolatile memory according to claim 3, wherein the semiconductor active layer comprises silicon.

7. The nonvolatile memory according to claim 1, wherein a structure of said semiconductor memory element is one selected from the group consisting of a structure having a floating gate electrode, an MNOS structure, and an MONOS structure.

8. The nonvolatile memory according to claim 2, wherein a structure of said semiconductor memory element is one selected from the group consisting of a structure having a floating gate electrode, an MNOS structure, and an MONOS structure.

9. The nonvolatile memory according to claim 3, wherein a structure of said semiconductor memory element is one selected from the group consisting of a structure having a floating gate electrode, an MNOS structure, and an MONOS structure.

10. The nonvolatile memory according to claim 1, wherein said semiconductor memory element is arranged in a NOR type memory cell array.

11. The nonvolatile memory according to claim 2, wherein said semiconductor memory element is arranged in a NOR type memory cell array.

12. The nonvolatile memory according to claim 3, wherein said semiconductor memory element is arranged in a NOR type memory cell array.

13. The nonvolatile memory according to claim 1, wherein said semiconductor memory element is arranged in a NAND type memory cell array.

14. The nonvolatile memory according to claim 2, wherein said semiconductor memory element is arranged in a NAND type memory cell array.

15. The nonvolatile memory according to claim 3, wherein said semiconductor memory element is arranged in a NAND type memory cell array.

16. A semiconductor memory device comprising the nonvolatile memory according to claim 1, wherein the semiconductor memory device is one selected from a group consisting of a game machine, a video camera, a head attaching type display, a DVD player, a personal computer, a portable telephone, and a car audio.

17. A semiconductor memory device comprising the nonvolatile memory according to claim 2, wherein the semiconductor memory device is one selected from a group consisting of a game machine, a video camera, a head attaching type display, a DVD player, a personal computer, a portable telephone, and a car audio.

18. A semiconductor memory device comprising the nonvolatile memory according to claim 3, wherein the semiconductor memory device is one selected from a group consisting of a game machine, a video camera, a head attaching type display, a DVD player, a personal computer, a portable telephone, and a car audio.

19. A nonvolatile memory comprising a semiconductor memory element, said semiconductor memory element comprising:
   a charge accumulating layer surrounded by an insulating film between a semiconductor active layer and a control gate electrode, said semiconductor active layer comprising a channel region and one conductive type impurity region,
   wherein the nonvolatile memory is formed over a substrate having an insulating surface;
   wherein the channel region is a polycrystal semiconductor film crystallized by being irradiated with continuously oscillating laser,
   wherein the semiconductor active layer is constituted by aggregating a plurality of crystal grains elongated in the same direction, and
   wherein a surface roughness of the channel region is 0.1 nm through 60 nm in a P-V value.

20. A nonvolatile memory comprising a semiconductor memory element, said semiconductor memory element comprising:
   a charge accumulating layer surrounded by an insulating film between a semiconductor active layer and a control gate electrode, said semiconductor active layer comprising a channel region and one conductive type impurity region,
   wherein the nonvolatile memory is formed over a substrate having an insulating surface; and
   wherein a surface roughness of the channel region is 0.1 nm through 60 nm in a P-V value.

21. A nonvolatile memory comprising a semiconductor memory element, said semiconductor memory element comprising:
   a charge accumulating layer surrounded by an insulating film between a semiconductor active layer and a control gate electrode, said semiconductor active layer comprising a channel region and one conductive type impurity region,
   wherein the nonvolatile memory is formed over a substrate having an insulating surface; and
   wherein a surface roughness of the channel region is 0.1 nm through 5 nm in an rms value.

22. The nonvolatile memory according to claim 19, wherein the semiconductor active layer comprises silicon.

23. The nonvolatile memory according to claim 20, wherein the semiconductor active layer comprises silicon.

24. The nonvolatile memory according to claim 21, wherein the semiconductor active layer comprises silicon.

25. The nonvolatile memory according to claim 19, wherein a structure of said semiconductor memory element is one selected from the group consisting of a structure having a floating gate electrode, an MNOS structure, and an MONOS structure.

26. The nonvolatile memory according to claim 20, wherein a structure of said semiconductor memory element is one selected from the group consisting of a structure having a floating gate electrode, an MNOS structure, and an MONOS structure.

27. The nonvolatile memory according to claim 21, wherein a structure of said semiconductor memory element is one selected from the group consisting of a structure having a floating gate electrode, an MNOS structure, and an MONOS structure.

28. The nonvolatile memory according to claim 19, wherein said semiconductor memory element is arranged in a NOR type memory cell array.

29. The nonvolatile memory according to claim 20, wherein said semiconductor memory element is arranged in a NOR type memory cell array.

30. The nonvolatile memory according to claim 21, wherein said semiconductor memory element is arranged in a NOR type memory cell array.

31. The nonvolatile memory according to claim 19, wherein said semiconductor memory element is arranged in a NAND type memory cell array.

32. The nonvolatile memory according to claim 20, wherein said semiconductor memory element is arranged in a NAND type memory cell array.

33. The nonvolatile memory according to claim 21, wherein said semiconductor memory element is arranged in a NAND type memory cell array.

34. A semiconductor memory device comprising the nonvolatile memory according to claim 19, wherein the semiconductor memory device is one selected from a group consisting of a game machine, a video camera, a head attaching type display, a DVD player, a personal computer, a portable telephone, and a car audio.

35. A semiconductor memory device comprising the nonvolatile memory according to claim 20, wherein the semiconductor memory device is one selected from a group consisting of a game machine, a video camera, a head attaching type display, a DVD player, a personal computer, a portable telephone, and a car audio.

36. A semiconductor memory device comprising the nonvolatile memory according to claim 21, wherein the semiconductor memory device is one selected from a group consisting of a game machine, a video camera, a head attaching type display, a DVD player, a personal computer, a portable telephone, and a car audio.

37. The nonvolatile memory according to claim 1, wherein a surface roughness of the channel region is 0.1 nm through 5 nm in an rms value.

38. The nonvolatile memory according to claim 19, wherein a surface roughness of the channel region is 0.1 nm through 5 nm in an rms value.

* * * * *